United States Patent
Hsieh

(10) Patent No.: US 8,575,690 B1
(45) Date of Patent: Nov. 5, 2013

(54) SUPER-JUNCTION TRENCH MOSFET HAVING DEEP TRENCHES WITH BURIED VOIDS

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/751,458

(22) Filed: Jan. 28, 2013

Related U.S. Application Data

(63) Continuation of application No. 13/568,297, filed on Aug. 7, 2012.

(51) Int. Cl.
- H01L 29/06 (2006.01)
- H01L 29/423 (2006.01)
- H01L 29/78 (2006.01)
- H01L 21/336 (2006.01)
- H01L 21/332 (2006.01)

(52) U.S. Cl.
USPC .......... 257/334; 257/330; 257/331; 257/332; 257/409; 257/E29.013; 257/E29.131; 257/E29.257; 257/E21.41; 257/E21.629; 438/138; 438/140; 438/268; 438/270

(58) Field of Classification Search
USPC .......... 257/330, 331, 332, 334, 409, E29.013, 257/E29.131, E29.257, E21.41, E21.629; 438/138, 140, 268, 270
See application file for complete search history.

(56) References Cited

U.S. PATENT DOCUMENTS

| | | | |
|---|---|---|---|
| 2009/0079002 A1* | 3/2009 | Lee et al. | 257/355 |
| 2011/0049614 A1* | 3/2011 | Gao et al. | 257/328 |
| 2011/0053326 A1* | 3/2011 | Gao et al. | 438/270 |
| 2012/0061754 A1* | 3/2012 | Hsieh | 257/331 |
| 2012/0074489 A1* | 3/2012 | Hsieh | 257/330 |
| 2012/0146133 A1* | 6/2012 | Hirler et al. | 257/330 |
| 2012/0187477 A1* | 7/2012 | Hsieh | 257/331 |
| 2012/0211831 A1* | 8/2012 | Hsieh | 257/334 |

* cited by examiner

Primary Examiner — Victor A Mandala
(74) Attorney, Agent, or Firm — Bacon & Thomas, PLLC

(57) ABSTRACT

A super-junction trench MOSFET is disclosed for high voltage device by applying a first doped column region of first conductivity type between a pair of second doped column regions of second conductivity type adjacent to sidewalls of a pair of deep trenches with buried voids in each unit cell for super-junction. Meanwhile, at least one trenched gate and multiple trenched source-body contacts are formed in each unit cell between the pair of deep trenches.

11 Claims, 25 Drawing Sheets

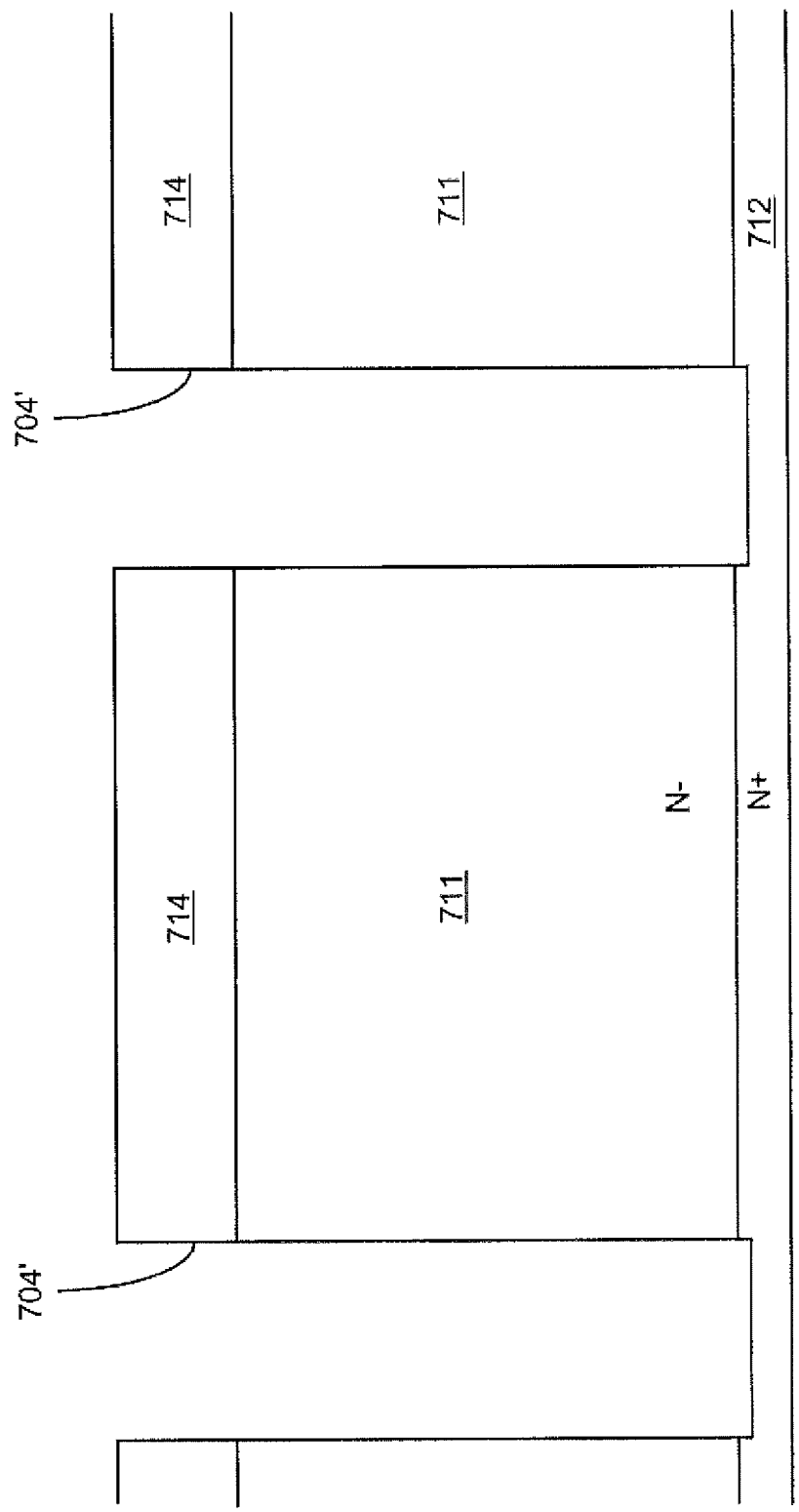

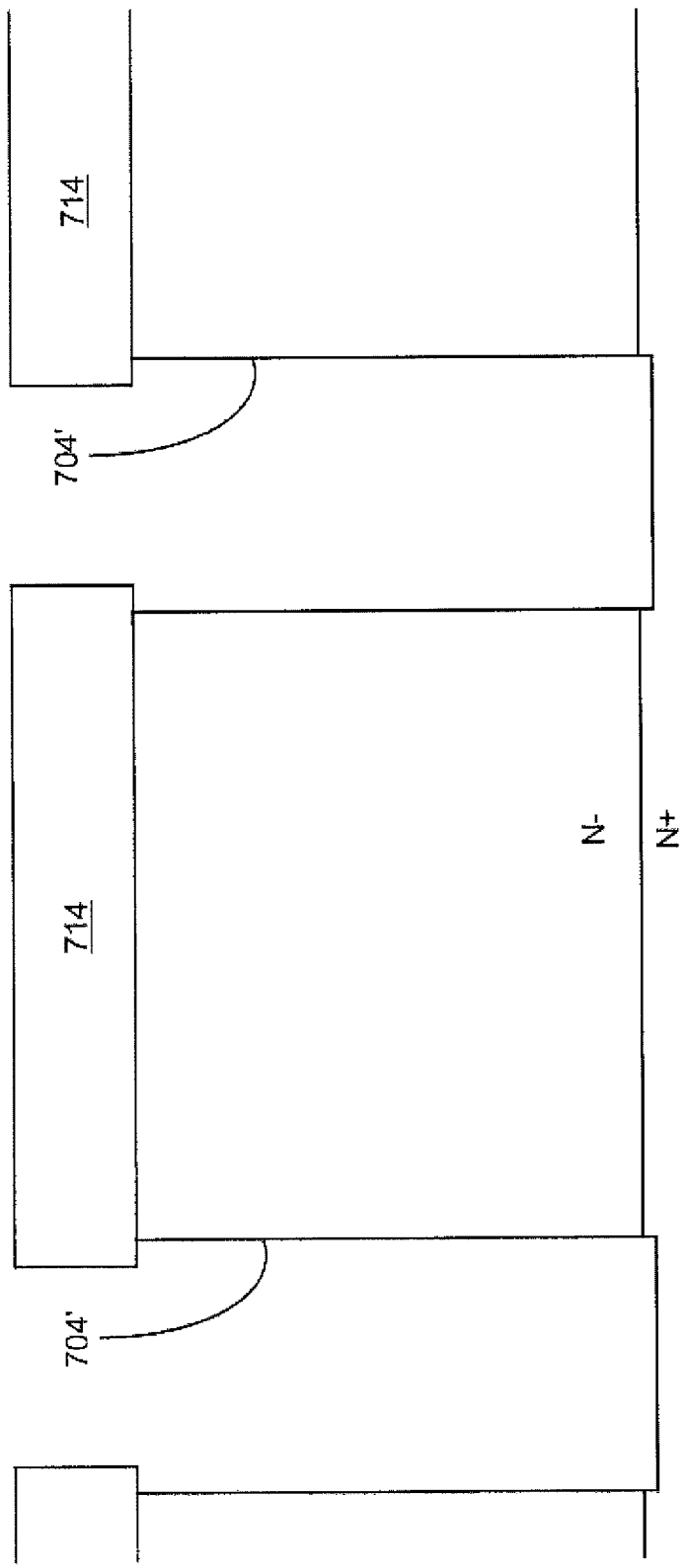

SUPER-JUNCTION TRENCH MOSFET HAVING DEEP TRENCHES WITH BURIED VOIDS

CROSS REFERENCE TO RELATED APPLICATIONS

This application is a Continuation-In-Part (CIP) of U.S. patent application Ser. No. 13/568,297 of the same inventor, filed on Aug. 7, 2012, entitled "super-junction trench MOSFET with multiple trenched gates in unit cell".

FIELD OF THE INVENTION

This invention relates generally to the cell structure, device configuration and fabrication process of power semiconductor devices. More particularly, this invention relates to a novel and improved cell structure, device configuration and improved process of a super-junction trench metal oxide semiconductor field effect transistor (MOSFET, the same hereinafter).

BACKGROUND OF THE INVENTION

Compared to the conventional trench MOSFETs, super-junction trench MOSFETs are more attractive due to higher breakdown voltage and lower specific Rds (drain-source resistance). As is known to all, a super-junction trench MOSFET is implemented by p type column structures and n type column structures arranged in parallel and connecting to each other onto a heavily doped substrate, however, the manufacturing yield is not stable because the super-junction trench MOSFET is very sensitive to the fabrication processes and conditions such as: the p type column structures and the n type column structures dopant re-diffusion issue induced by subsequent thermal processes; trapped charges within the column structures, etc. . . . All that will cause a hazardous condition of charges imbalance to the super-junction trench MOSFETs. More specifically, these undesired influences become more pronounced with a narrower column structure width for a lower bias voltage ranging under 200V.

U.S. Pat. No. 7,601,597 disclosed a method to avoid the aforementioned p type column structure and the n type structure dopant re-diffusion issue, for example in an N-channel trench MOSFET as shown in FIG. 1A, by setting up the p type column formation process at a last step after all diffusion processes such as: sacrificial oxidation after trench etch, gate oxidation, P body region formation and n+ source region formation, etc. . . . have been finished.

However, the disclosed method of this prior art is not effective because that, firstly, the p type column structure is formed by growing an additional p type epitaxial layer in deep trenches etched in an n type epitaxial layer; secondly, an additional CMP (Chemical Mechanical Polishing) is required for surface planarization after the p type epitaxial layer is grown; thirdly, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structure is still not resolved.

Prior arts (paper "Industrialization of Resurf stepped oxide technology for Power Transistor", by M. A. Gajda, etc., and paper "Tunable Oxide-Bypassed Trench Gate MOSFET Breaking the Ideal Super-junction MOSFET Performance Line at Equal Column Width", by Xin Yant, etc.) disclosed device structures in order to resolve the limitation caused by the conventional super-junction trench MOSFET discussed above, as shown in FIG. 1B and FIG. 1C. Both the device structures in FIG. 1B and FIG. 1C can achieve a lower specific Rds and a higher breakdown voltage than a conventional super-junction trench MOSFET because each the epitaxial layer formed in FIG. 1B and FIG. 1C has a higher doping concentration than the conventional super-junction trench MOSFET.

Refer to FIG. 1B and FIG. 1C again, both the device structures have a deep trench with a thick oxide layer along trench sidewalls and bottoms into a drift region. Only difference is that, the device structure in FIG. 1B has a single epitaxial layer (N Epi, as illustrated in FIG. 1B) while the device structure in FIG. 1C has double epitaxial layers (Epi1 and Epi2, as illustrated in FIG. 1C, the Epi1 supported on a heavily doped substrate has a lower doping concentration than the Epi2 near a channel region.) Due to the p type column structure and the n type column structure inter-diffusion, both the device structures in FIG. 1B and FIG. 1C do not have charges imbalance issue, resolving the technical limitation caused by the conventional super-junction trench MOSFET, however, the benefit of both the device structures in FIG. 1B and FIG. 1C over the conventional super-junction trench MOSFET only pronounces at the bias voltage ranging under 200V, which means that, the conventional super-junction trench MOSFET has a lower Rds when the bias voltage is beyond 200V.

Therefore, there is still a need in the art of the semiconductor power device, particularly for super-junction trench MOSFET design and fabrication, to provide a novel cell structure, device configuration that would resolve these difficulties and design limitations.

SUMMARY OF THE INVENTION

The present invention provides a super-junction trench MOSFET having additional freedom for better performance optimization and manufacturing capability by tuning a thick oxide thickness to minimize influence of the charges imbalance, trapped charges, etc. Moreover, a single epitaxial layer is required to achieve a better cost effective than the prior arts. Moreover, the present invention also provides deep trenches with buried voids and multiple trenched gates in unit cell.

According to another aspect, the present invention features a super-junction trench MOSFET comprising a plurality of unit cells with each comprising: a substrate of a first conductivity type; an epitaxial layer of the first conductivity type onto the substrate, wherein the epitaxial layer has a lower doping concentration than the substrate; a pair of deep trenches filled with dielectric material, starting from a top surface of the epitaxial layer and extending downward into the epitaxial layer, each comprising a buried void inside the dielectric material; a mesa between the pair of the deep trenches; a first doped column region of the first conductivity type formed in the mesa; a pair of second doped column regions of a second conductivity type formed in the mesa and adjacent to sidewalls of the deep trenches, located in parallel with and surrounding the first doped column region; a body region of the second conductivity type formed in the mesa and covering a top surface of the first doped column region and the second doped column regions; at least one trenched gate filled with doped poly-silicon layer and padded by a gate oxide layer, starting from top surface of the mesa and penetrating through the body region and extending into the first doped column region; multiple trenched source-body contacts in the mesa, each filled with a contact metal plug, penetrating through a contact interlayer and extending into the body region; and a source region of the first conductivity type formed near the top surface of the body region, located between an upper portion of each the trenched gate and sidewalls of adjacent trenched source-body contact, wherein the source region has a higher doping concentration than the epitaxial layer.

According to another aspect of the present invention, the super-junction trench MOSFET further comprises a trenched gate for gate connection, which is connected to a gate metal via a trenched gate contact, wherein the trenched gate for gate connection is penetrating through the body region and extending into the first doped column region without having the source region surrounded.

According to another aspect of the present invention, in some preferred embodiments, the super-junction trench MOSFET further comprises a termination area including multiple guard rings of the second conductivity type.

According to another aspect of the present invention, in some preferred embodiments, the deep trenches each has a trench bottom above the substrate and underneath a bottom surface of each of the first doped column region and the second doped column regions; in some other preferred embodiments, the deep trenches each has a trench bottom further extending into the substrate, and the first doped column region and the second doped column regions each has a bottom surface reaching the substrate.

According to another aspect of the present invention, in some preferred embodiments, there is only one trenched gate formed in each unit cell; in some other preferred embodiments, there are multiple trenched gates formed in each unit cell for further Rds reduction due to less channel resistance, and for ESD (Electrostatic Discharge) capability enhancement due to larger capacitance.

According to another aspect of the present invention, in some preferred embodiments, the gate oxide layer padded the doped poly-silicon layer has thickness along bottom of the trenched gate equal to or thinner than along sidewalls of the trenched gate; in some other preferred embodiments, the gate oxide layer padded the doped poly-silicon layer padded by a gate oxide layer has thickness along the bottom of the trenched gate thicker than along sidewalls of the trenched gates.

According to another aspect of the present invention, in some preferred embodiments, the first conductivity type is N type and the second conductivity type is P type; in some other preferred embodiments, the first conductivity type is P type and the second conductivity type is N type.

The invention also features a method of making a unit cell of a super-junction trench MOSFET with shielded electrode, including: forming a pair of deep trenches inside an epitaxial layer of a first conductivity type onto a substrate of said first conductivity type; carrying out angle ion implantation of the first conductivity type dopant and diffusion to form a first doped column region with column shape within a mesa area between every two adjacent of the deep trenches; carrying out angle ion implantation of a second conductivity type dopant and diffusion to form second doped column regions with column shape adjacent to sidewalls of the deep trenches, in parallel with and surrounding the first doped column region; depositing a dielectric material with buried voids in the deep trenches; forming a least one trenched gates extending into the first doped column region between the pair of deep trenches; and forming body regions of the second conductivity type and source regions of the first conductivity type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 14A~14I are a serial of side cross-sectional views for showing the processing steps for fabricating the super-junction trench MOSFET.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
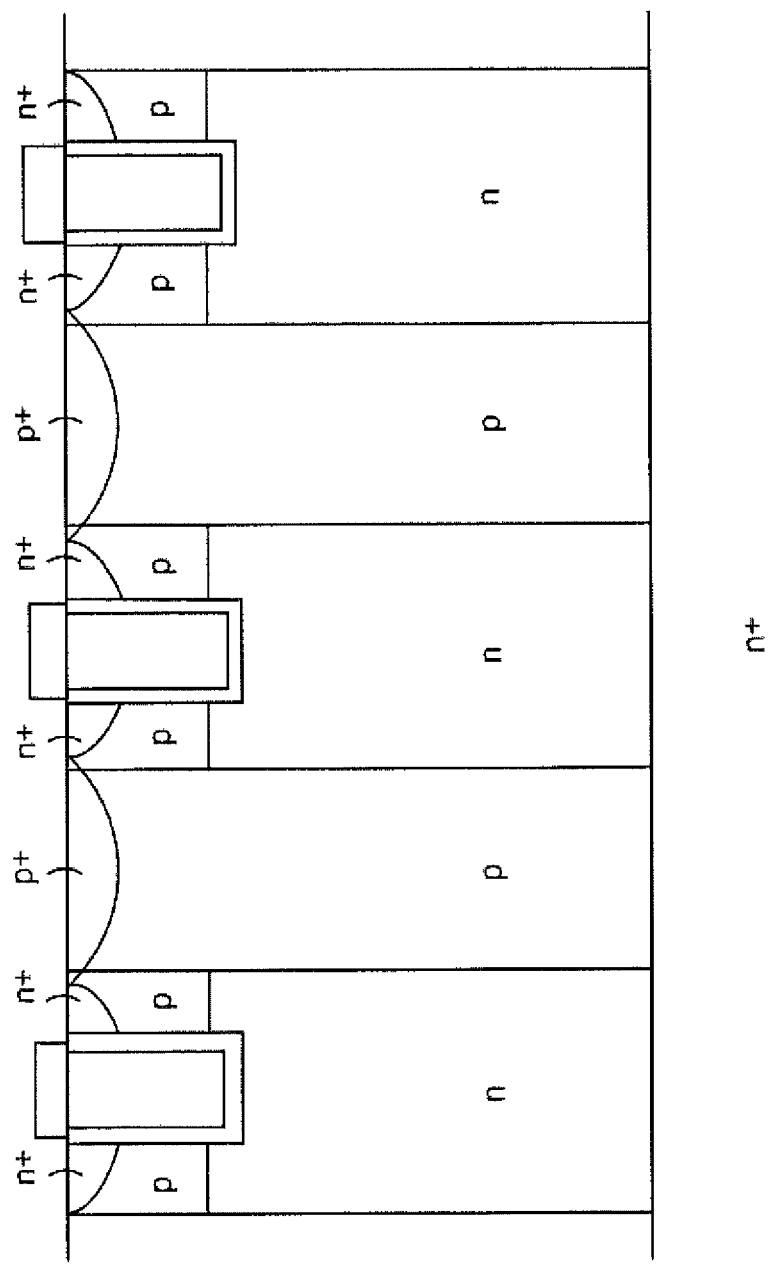
FIG. 1A is a cross-sectional view of a super-junction trench MOSFET of prior art.
Figure 1B:
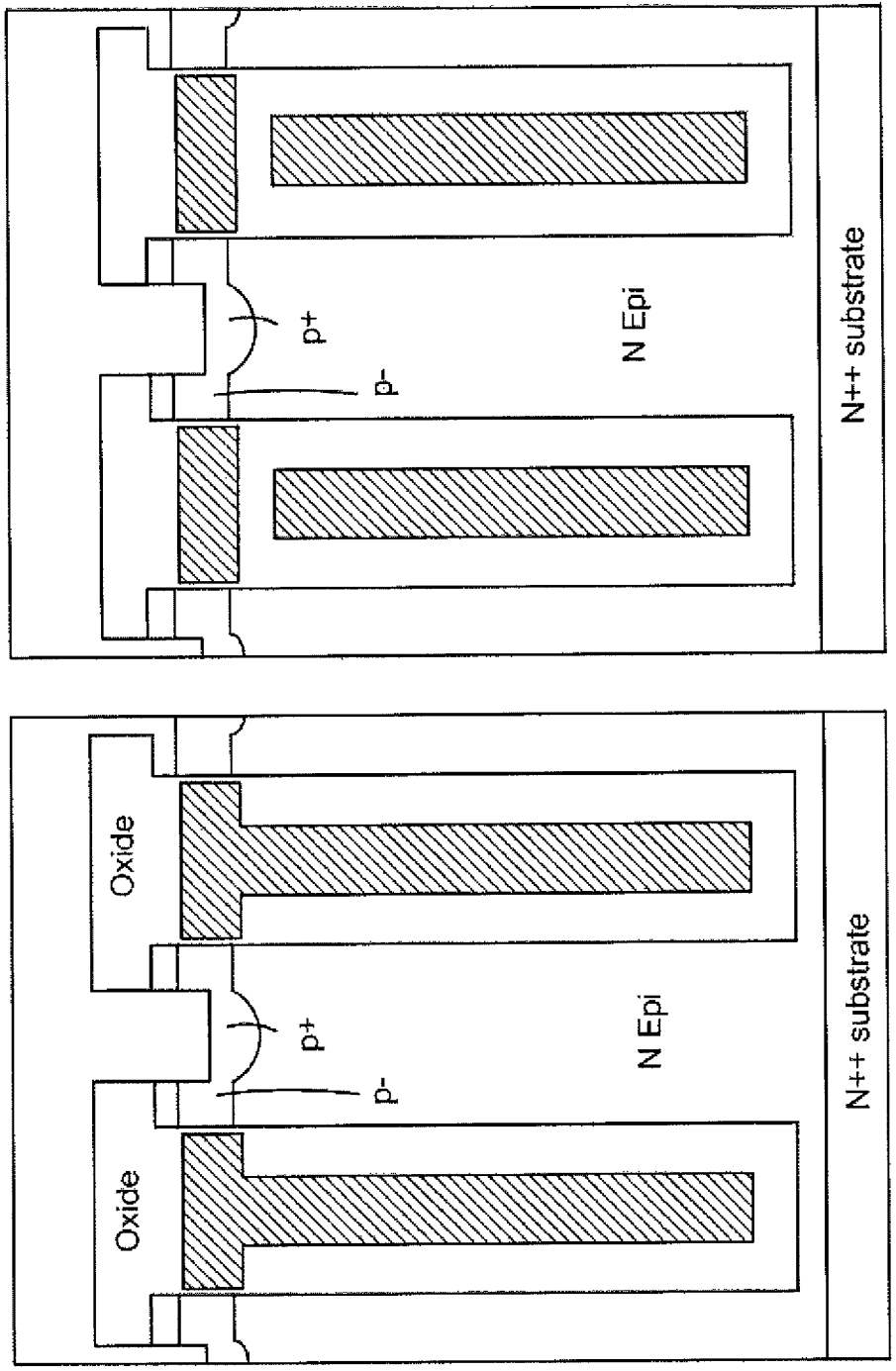
FIG. 1B is a cross-sectional view of a trench MOSFET of another prior art.
Figure 1C:
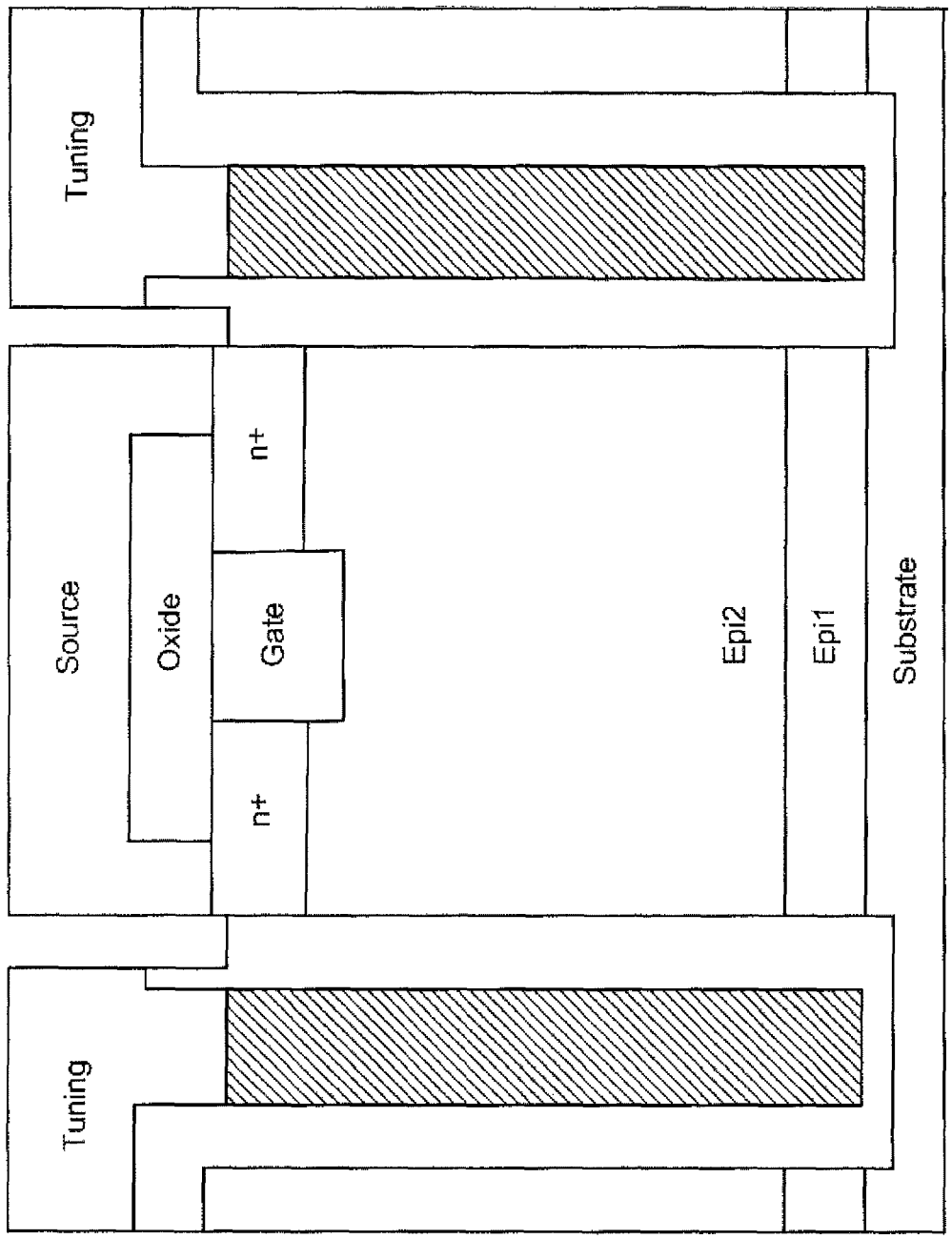
FIG. 1C is a cross-sectional view of a trench MOSFET of another prior art.
Figure 2A:
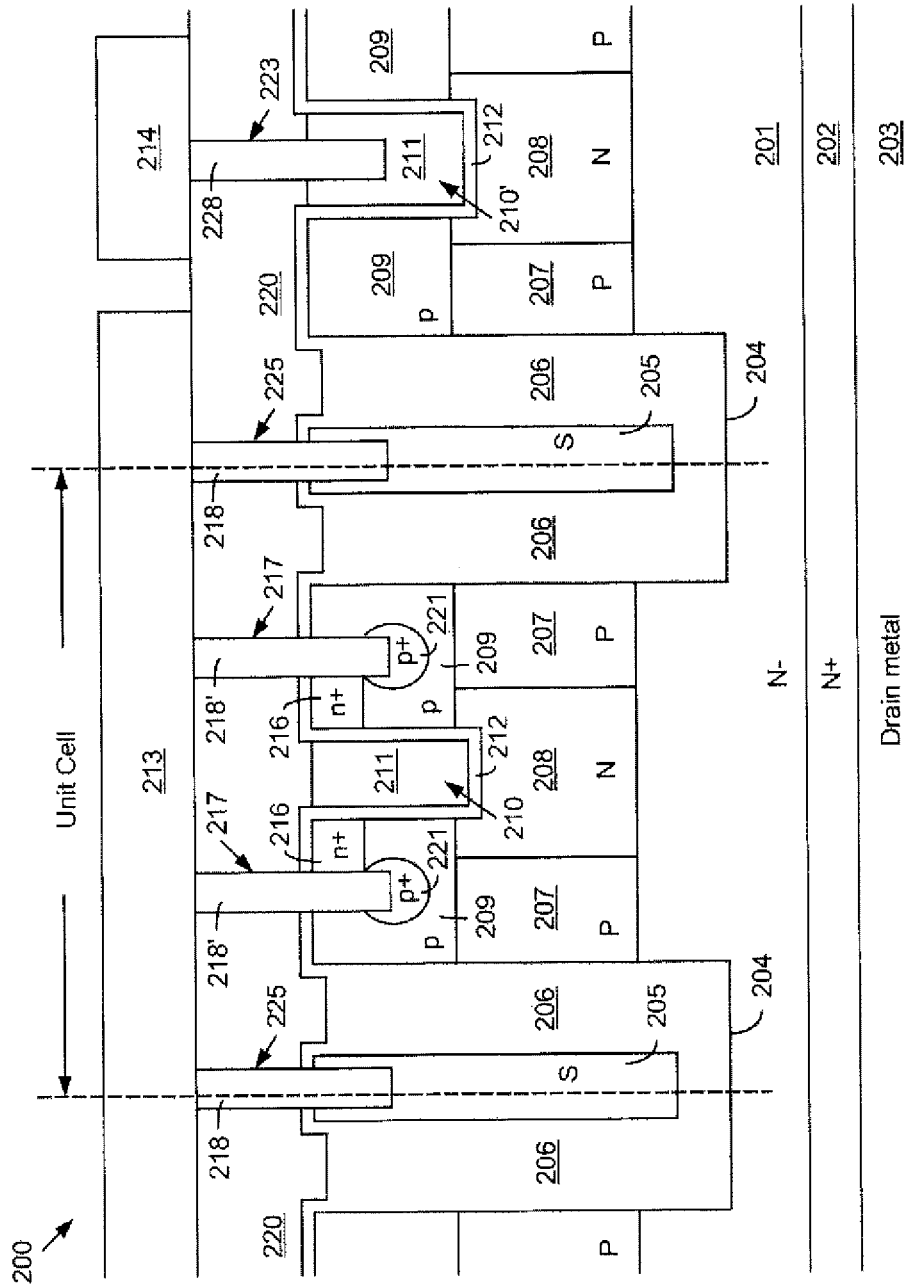
FIG. 2A is a cross-sectional view of a preferred embodiment according to the present invention.

Please refer to FIG. 2A for a preferred embodiment of this invention wherein an N-channel super-junction trench MOSFET 200 is formed in an N− epitaxial layer 201 supported onto an N+ substrate 202 which coated with a back metal 203 of Ti/Ni/Ag on its rear side as drain metal. The N-channel super-junction trench MOSFET 200 comprises a plurality of unit cells with each comprising a pair of deep trenches 204 formed starting form a top surface of the epitaxial layer 201 and vertically down extending, not reaching an interface of the epitaxial 201 and the substrate 202. Inside each of the deep trenches 204, a shielded electrode 205 padded by a thick dielectric layer 206 is formed therein. The shielded electrode 205 is connected to a source metal 213 of the trench MOSFET 200 via a trenched source contact 225 which is filled with a contact metal plug 218, penetrating through a contact interlayer 220 and extending into the shielded electrode 205. A mesa is therefore formed between the pair of the deep trenches 204 in each unit cell wherein an N first doped column region 208 is formed. Adjacent to sidewalls of the deep trenches 204, a pair of P second doped column regions 207 are formed in the mesa and in parallel surrounding with the N first doped column region 208. The N first doped column region 208 and the P second doped column regions 207 all have column bottoms above trench bottoms of the deep trenches 204. Onto a top surface of the N first doped column region 208 and the P second doped column regions 207, a p body region 209 is formed between in the mesa extending between the pair of the deep trenches. A trenched gate 210 is penetrating through the p body region 209 further extending into the N first doped column region 208 in each unit cell as shown by dashed lines, wherein the trenched gate 210 comprises a gate electrode 211 padded by a gate oxide layer 212, wherein the gate electrode 211 is further connected to a gate metal 214 of the trench MOSFET 200 by extending to a trenched gate 210' for gate connection via a trenched gate contact 223 filled with a contact metal plug 228, wherein the trenched gate 210' for gate connection has a same filling-in material as the trenched gate 210. More preferred, the trenched gate 210' for gate connection has a greater trench width than the trenched gate 210. Onto a top surface of the gate electrodes 211, the contact interlayer 220 is formed to isolate the gate electrodes 211 from the source metal 213. In each the mesa, multiple trenched source-body contacts 217 with each filled with a tungsten plug 218' are formed penetrating through the contact interlayer 220 and extending into the p body region 209 in each unit cell, and an n+ source regions 216 is formed surrounding an upper portion of the trenched gate 210, extending between the upper portion of the trenched gate 210 and sidewalls of adjacent trenched source-body contact 217. Therefore, the p body region 209 and the n+ source region 216 are connected to the source metal 213 via the multiple trenched source-body contacts 217. Furthermore, a p+ body contact region 221 is formed surrounding at least bottom of each the trenched source-body contact 217 to reduce the contact resistance between the tungsten plugs 218' and the p body region 209. In this preferred embodiment, all the contact metal plugs can be implemented by using a tungsten plug padded by a barrier metal layer of Ti/TiN or Co/TiN or Ta/TiN.

Figure 2B:
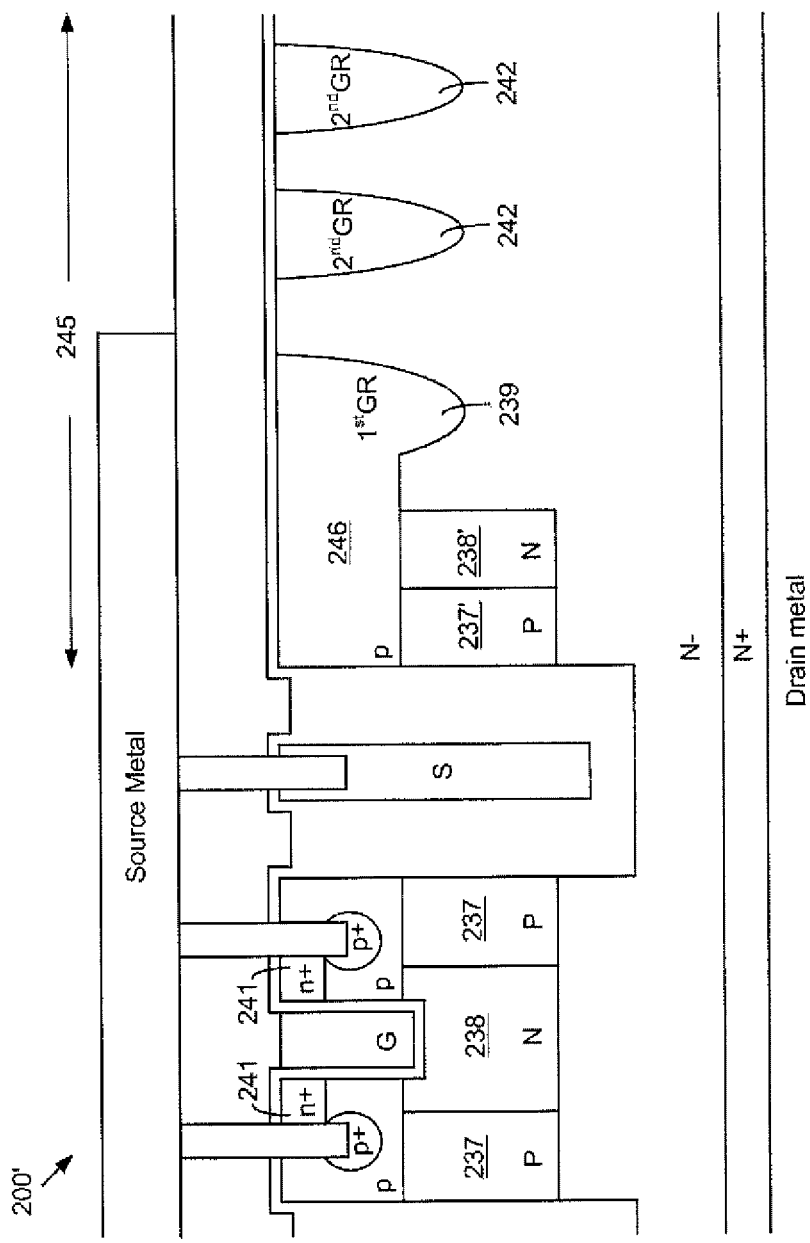
FIG. 2B is a cross-sectional view of another preferred embodiment according to the present invention.

FIG. 2B shows a cross-sectional view of another preferred super-junction trench MOSFET 200' according to the present invention which has a similar structure as the super-junction trench MOSFET 200 in FIG. 2A by having the N first doped column region 238 and the P second doped column region 237, except that, N-channel trench MOSFET 200' in FIG. 2B further comprises a termination area 245 including multiple guard rings, among which a first type guard ring 239 ($1^{st}$ GR, as illustrated in FIG. 2B) is connected with the n+ source region 241, and second type guard rings ($2^{nd}$ GR, as illustrated in FIG. 2B) 242 are floating guard rings which have floating voltage in termination area 245, wherein the first type guard ring 239 and the second type guard rings 242 all have junction depths greater than the p body region 246. Moreover, the first type guard ring 239 is connected with a N third doped column region 238' having about half column width of the N first doped column region 238 and a P type doped column region 237' having about same column width as the P second doped column region 237 through the p body region 246.

Figure 3:
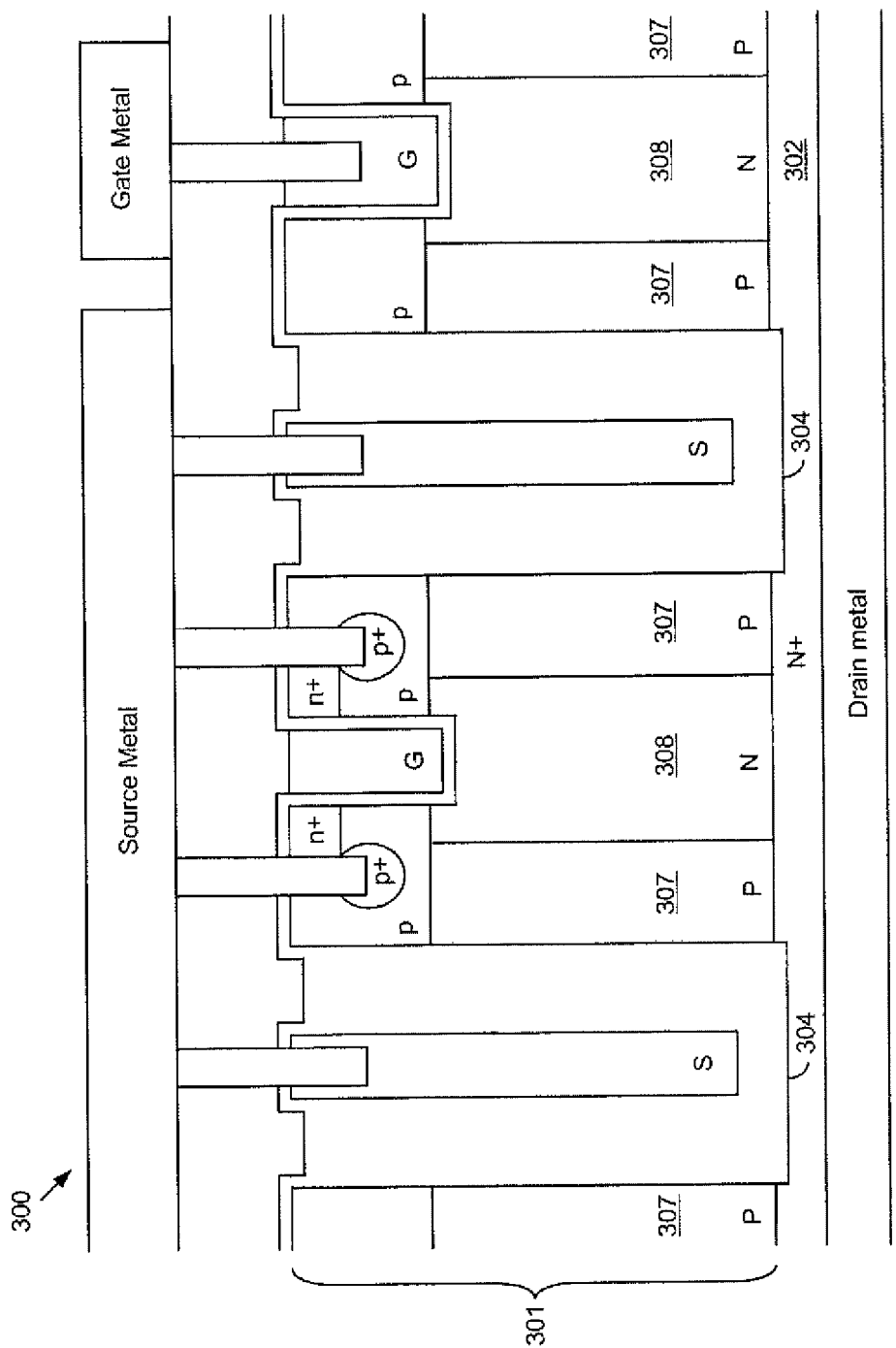
FIG. 3 is a cross-sectional view of another preferred embodiment according to the present invention.

FIG. 3 shows a cross-sectional view of another preferred N-channel super-junction trench MOSFET 300 according to the present invention, which is similar to the super-junction trench MOSFET 200 in FIG. 2A except that, in FIG. 3, the deep trenches 304 starting from a top surface of the N-epitaxial layer 301 is penetrate through the N− epitaxial layer 301 and further extending into N+ substrate 302. Besides, column bottoms of the first doped column region 308 and the second doped column regions 307 reach the interface between the N-epitaxial layer 301 and the N+ substrate 302.

Figure 4:
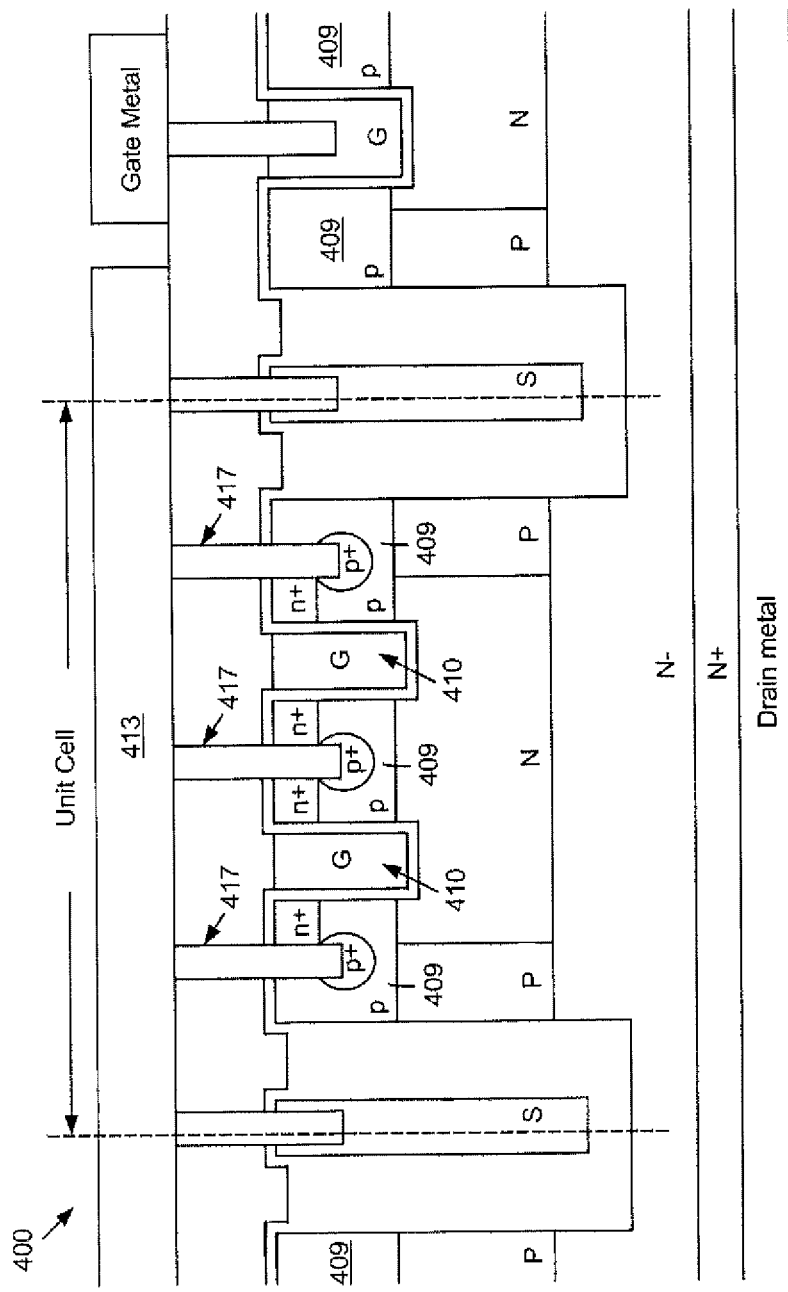
FIG. 4 is a cross-sectional view of another preferred embodiment according to the present invention.

FIG. 4 shows a cross-sectional view of another preferred N-channel super-junction trench MOSFET 400 according to the present invention, which is similar to the super-junction trench MOSFET 200 in FIG. 2A except that, in FIG. 4, there are multiple trenched gates 410 formed in each unit cell for further Rds reduction due to less channel resistance, and for ESD capability enhancement due to larger capacitance. And as shown in FIG. 4, each part of the p body region 409 is connected to the source metal 413 of the MOSFET 400 via a trenched source-body contact 417.

Figure 5:
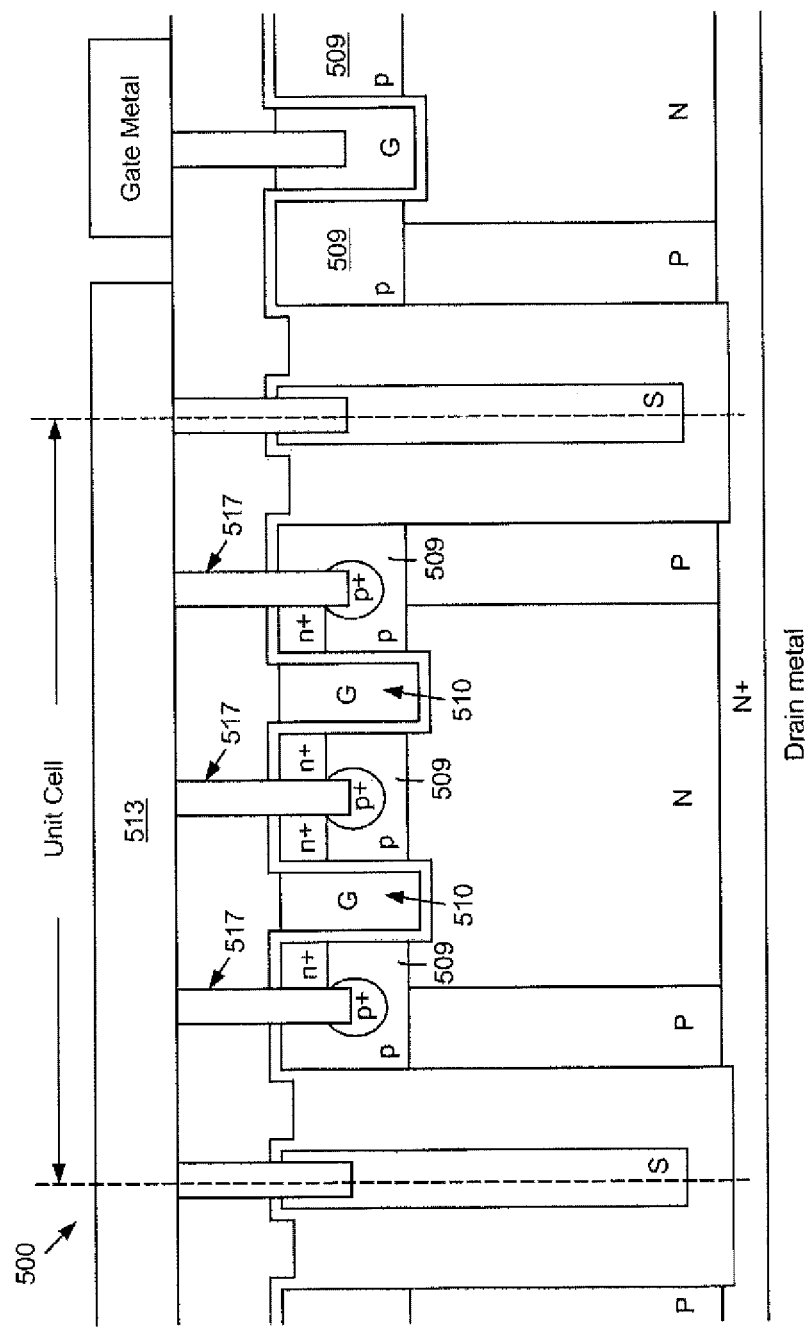
FIG. 5 is a cross-sectional view of another preferred embodiment according to the present invention.

FIG. 5 shows a cross-sectional view of another preferred N-channel super-junction trench MOSFET 500 according to the present invention, which is similar to the super-junction trench MOSFET 300 in FIG. 3 except that, in FIG. 5, there are multiple trenched gates 510 formed in each unit cell for further Rds reduction due to less channel resistance, and for ESD capability enhancement due to larger capacitance. And as shown in FIG. 5, each part of the p body region 509 is connected to the source metal 513 of the MOSFET 500 via a trenched source-body contact 517.

Figure 6:
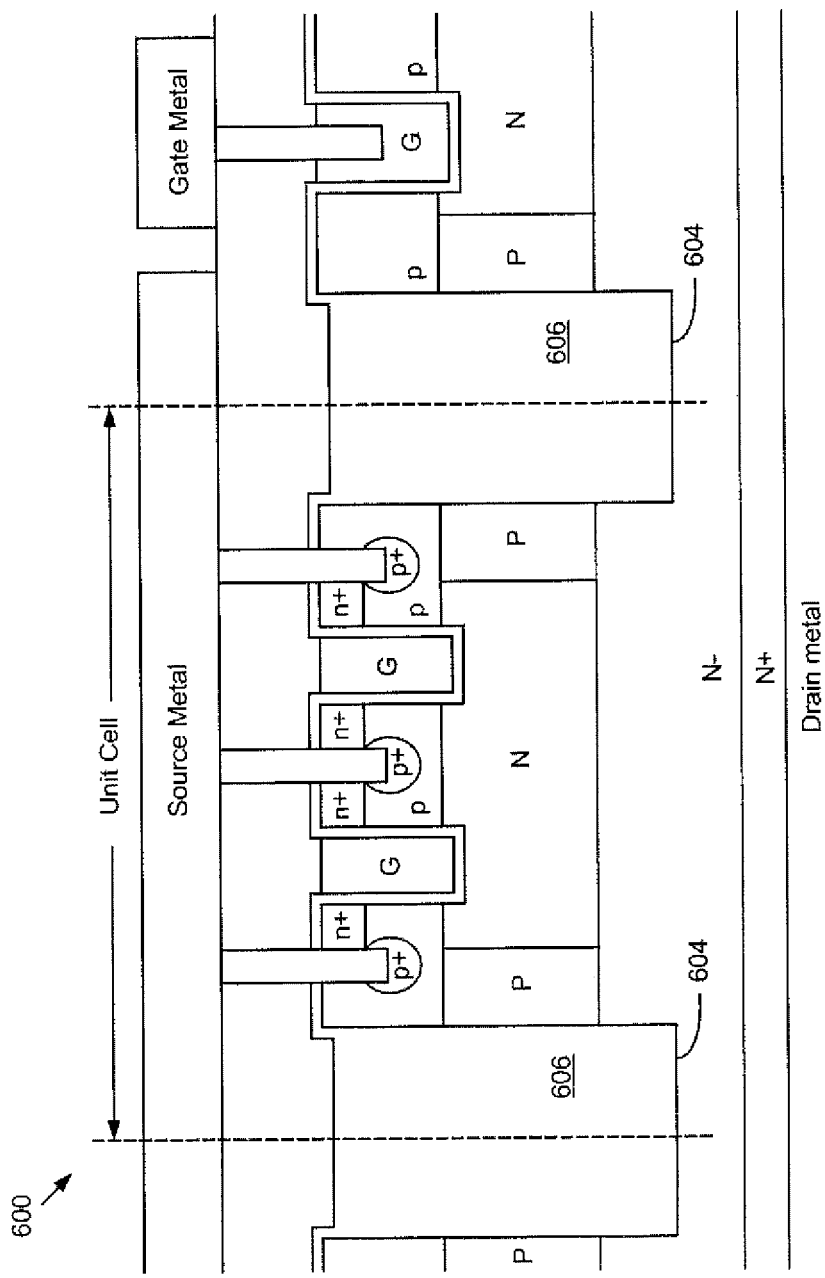
FIG. 6 is a cross-sectional view of another preferred embodiment according to the present invention.

FIG. 6 shows a cross-sectional view of another preferred N-channel super-junction trench MOSFET 600 according to the present invention, which is similar to FIG. 4 except that, in FIG. 6, the deep trenches 604 are only filled with the thick dielectric material 606 without having shielded electrodes.

Figure 7:
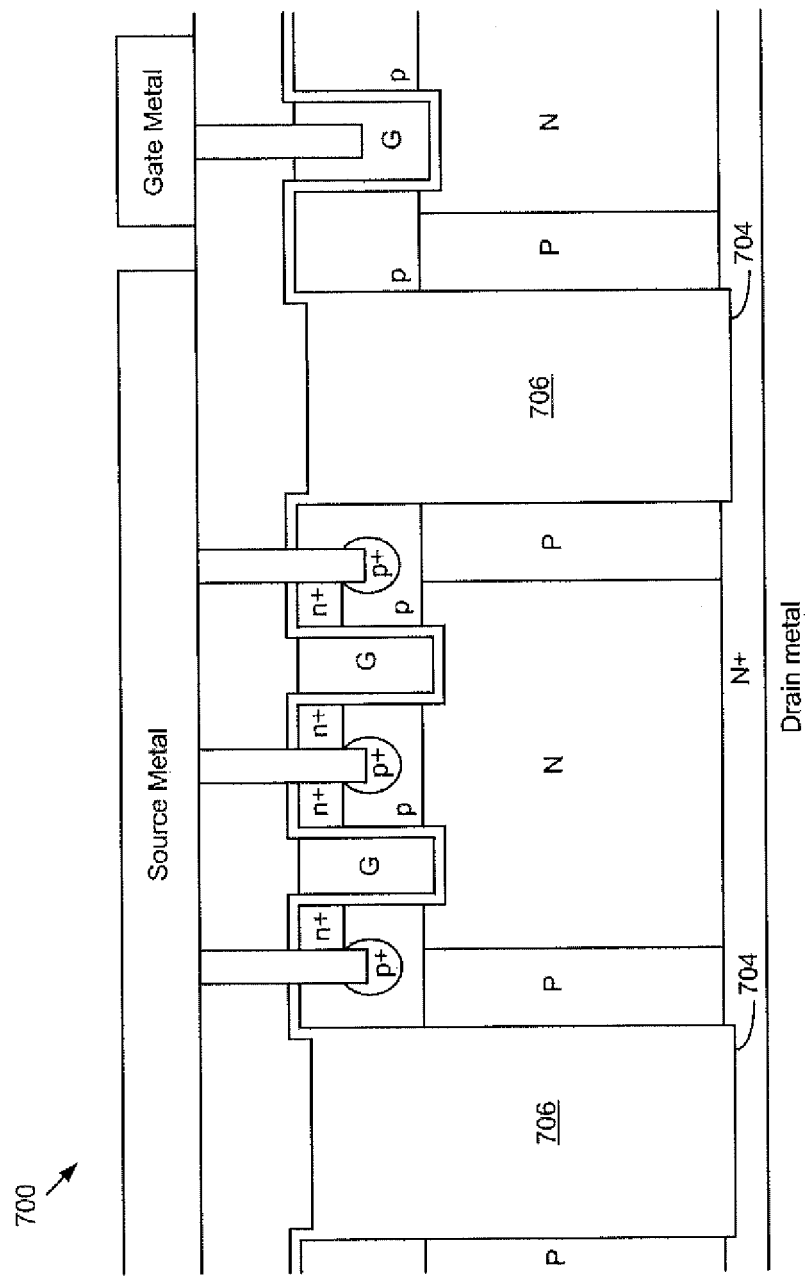
FIG. 7 is a cross-sectional view of another preferred embodiment according to the present invention.

FIG. 7 shows a cross-sectional view of another preferred N-channel super-junction trench MOSFET 700 according to the present invention, which is similar to FIG. 5 except that, in FIG. 7, the deep trenches 704 are only filled with the thick dielectric material 706 without having shielded electrodes.

Figure 8:
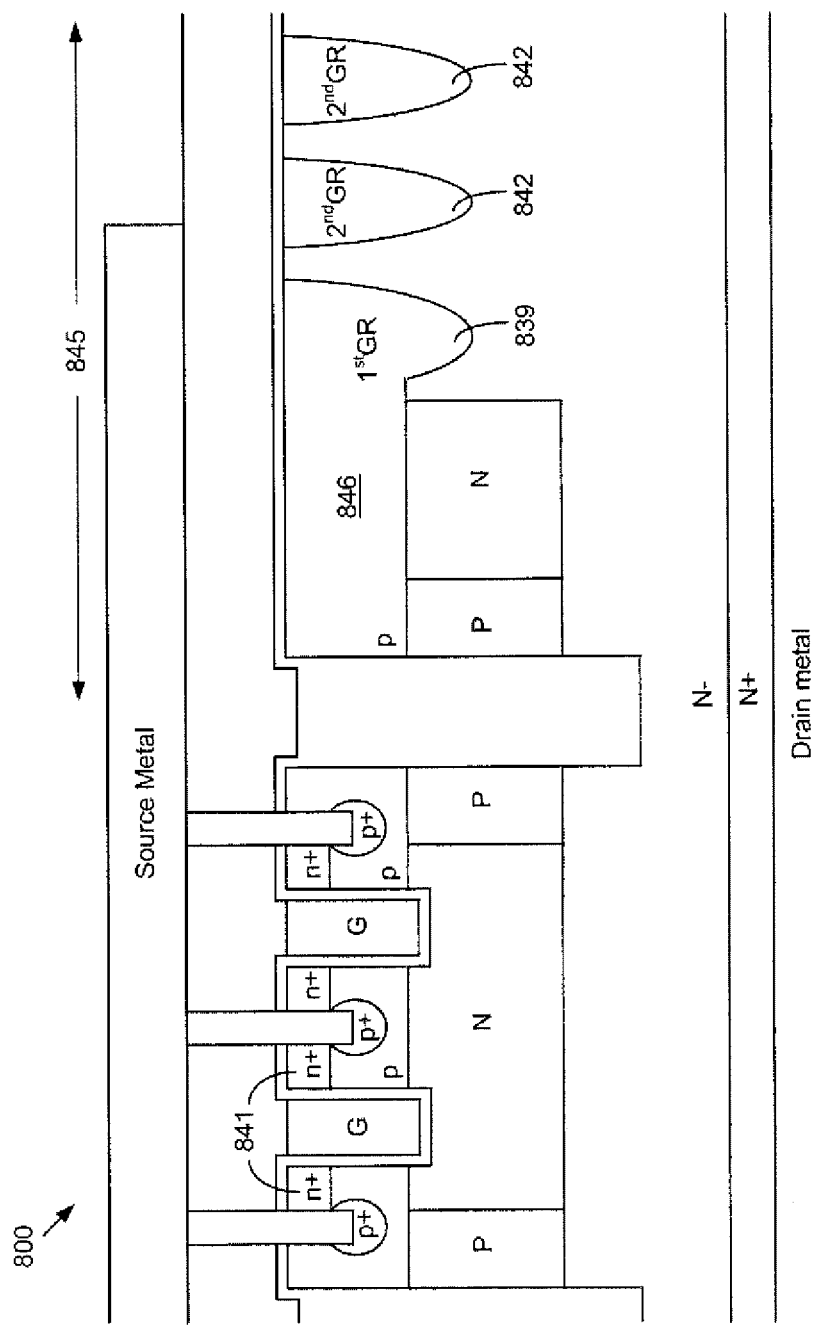
FIG. 8 is a cross-sectional view of another preferred embodiment according to the present invention.

FIG. 8 shows a cross-sectional view of another preferred super-junction trench MOSFET 800 according to the present invention which has a similar structure as the super-junction trench MOSFET 600 in FIG. 6, except that, N-channel trench MOSFET 800 in FIG. 8 further comprises a termination area 845 including multiple guard rings, among which a first type guard ring 839 ($1^{st}$ GR, as illustrated in FIG. 8) is connected with the n+ source region 841, and second type guard rings ($2^{nd}$ GR, as illustrated in FIG. 8) 842 are floating guard rings which have floating voltage in termination area 845, wherein the first type guard ring 839 and the second type guard rings 842 all have junction depths greater than the p body region 846.

Figure 9:
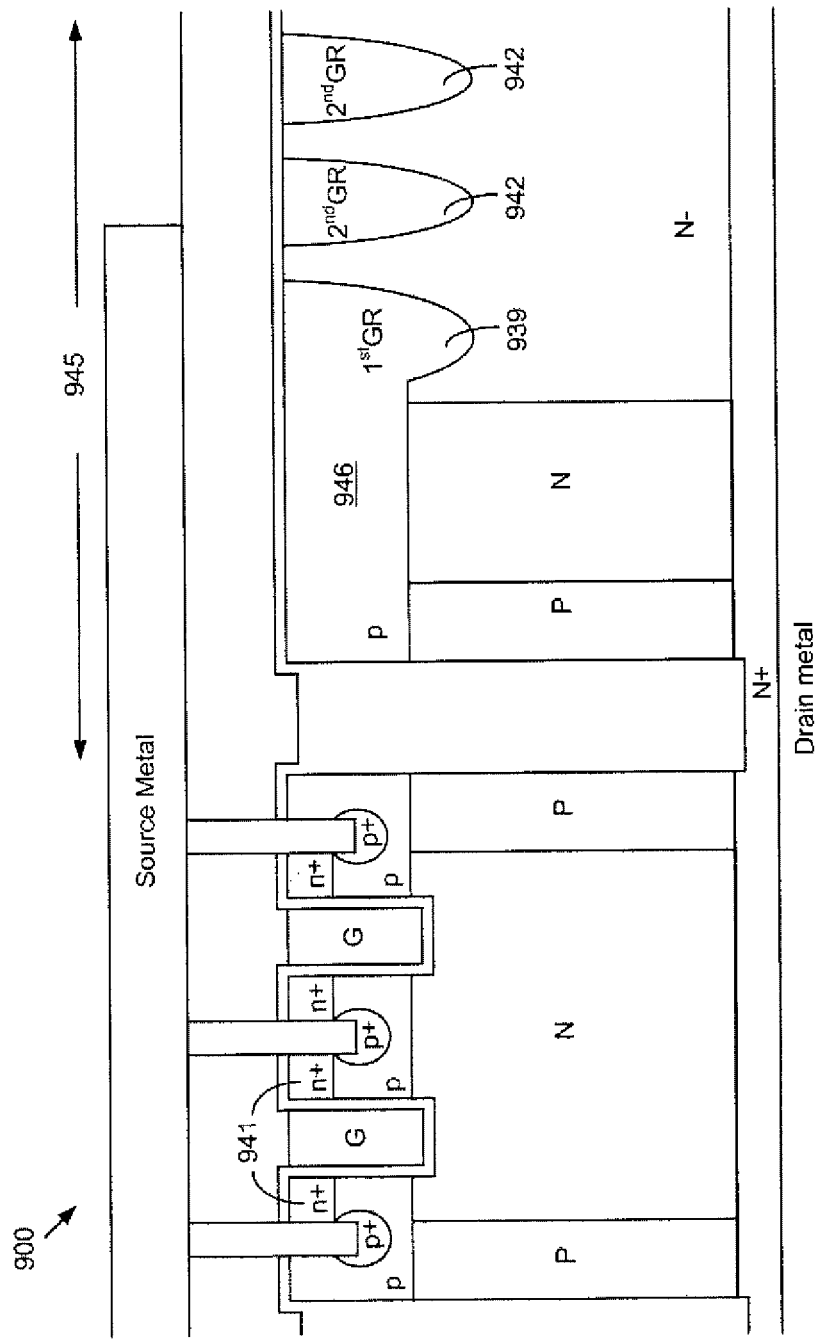
FIG. 9 is a cross-sectional view of another preferred embodiment according to the present invention.

FIG. 9 shows a cross-sectional view of another preferred super-junction trench MOSFET 900 according to the present invention which has a similar structure as the super-junction trench MOSFET 700 in FIG. 7, except that, N-channel trench MOSFET 900 in FIG. 9 further comprises a termination area 945 including multiple guard rings, among which a first type guard ring 939 ($1^{st}$ GR, as illustrated in FIG. 9) is connected with the n+ source region 941, and second type guard rings ($2^{nd}$ GR, as illustrated in FIG. 9) 942 are floating guard rings which have floating voltage in termination area 945, wherein the first type guard ring 939 and the second type guard rings 942 all have junction depths greater than the p body region 946.

Figure 10:
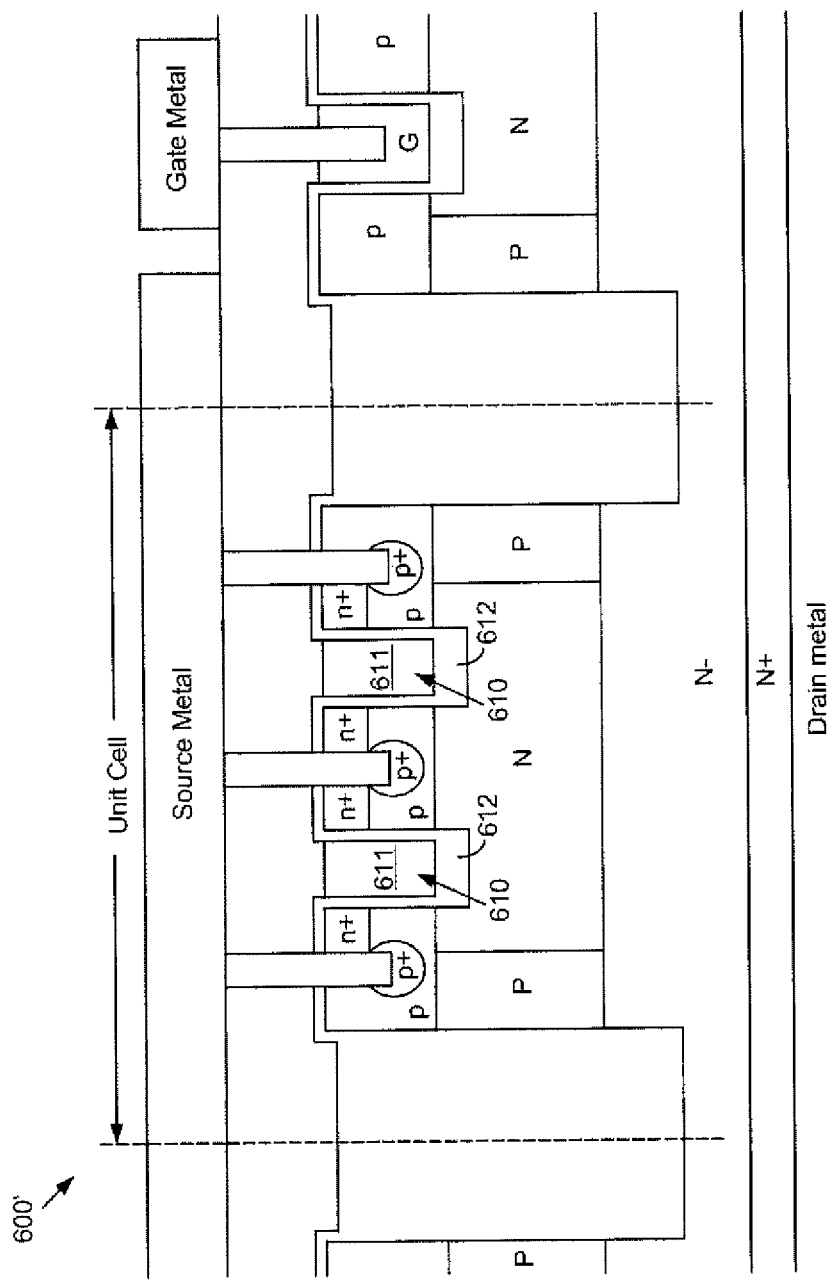
FIG. 10 is a cross-sectional view of another preferred embodiment according to the present invention.

FIG. 10 shows a cross-sectional view of another preferred N-channel super junction trench MOSFET 600' according to the present invention which has a similar structure as the super-junction trench MOSFET 600 in FIG. 6 except that, in FIG. 10, each the trenched gate 610 comprises a doped poly-silicon layer 611 padded by a gate oxide layer 612, wherein the gate oxide layer 612 has a greater thickness along bottom of each the trenched gate 610 than along sidewalls of each the trenched gate 610. However in FIG. 6, the gate oxide layer has thickness along bottom of each the trenched gate equal to or thinner than along sidewalls of each the trenched gate.

Figure 11:
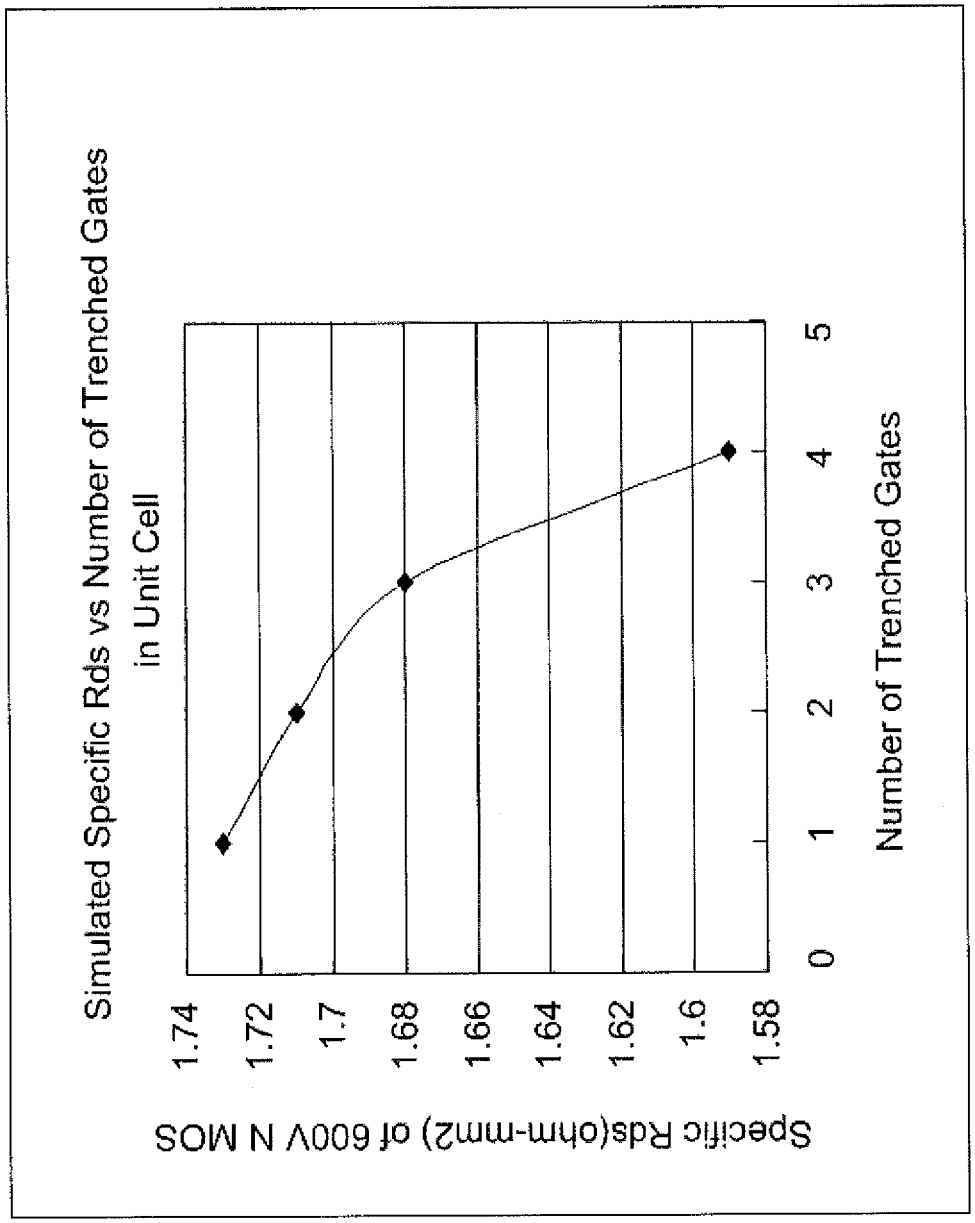
FIG. 11 is a diagram showing the relationship between simulated specific Rds and number of the trenched gates in unit cell.

FIG. 11 shows the relationship between simulated specific Rds and number of trenched gates ranging from one to four, from the diagram it can be seen that, in unit cell, the simulated specific Rds decreases with increasing trenched gates number.

Figure 12:
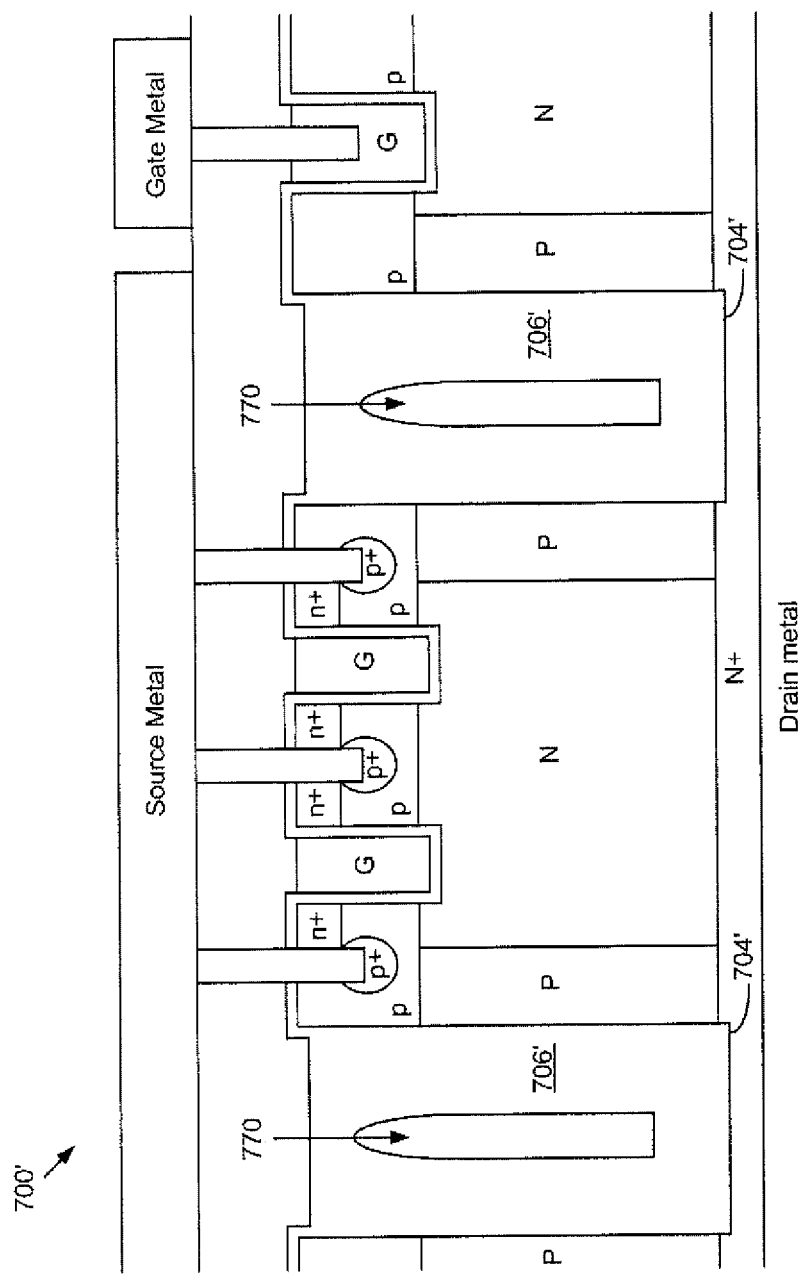
FIG. 12 is a cross-sectional view of another preferred embodiment according to the present invention.

FIG. 12 shows a cross-sectional view of another preferred N-channel super junction trench MOSFET 700' according to the present invention which has a similar structure as the super-junction trench MOSFET 700 in FIG. 7 except that, in FIG. 12, there is a buried void 770 inside the thick dielectric material 706' in each of the deep trenches 704'.

Figure 13:
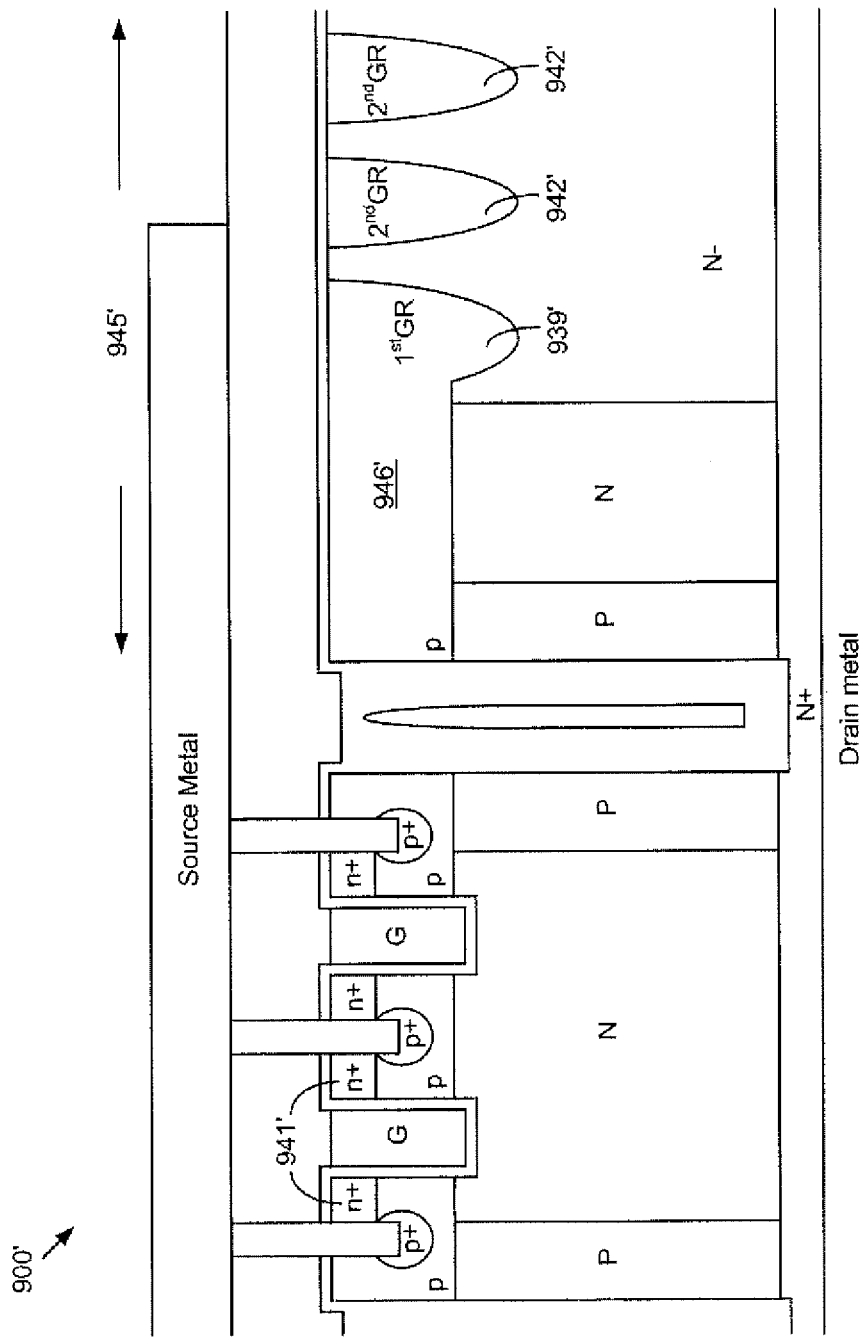
FIG. 13 is a cross-sectional view of another preferred embodiment according to the present invention.

FIG. 13 shows a cross-sectional view of another preferred super-junction trench MOSFET 900' according to the present invention which has a similar structure as the super-junction trench MOSFET 700' in FIG. 12, except that, N-channel trench MOSFET 900' in FIG. 13 further comprises a termination area 945' including multiple guard rings, among which a first type guard ring 939' ($1^{st}$ GR, as illustrated in FIG. 13) is connected with the n+ source region 941', and second type guard rings 942' ($2^{nd}$ GR, as illustrated in FIG. 13) are floating guard rings which have floating voltage in termination area 945', wherein the first type guard ring 939' and the second type guard rings 942' all have junction depths greater than the p body region 946'.

Figure 14C:
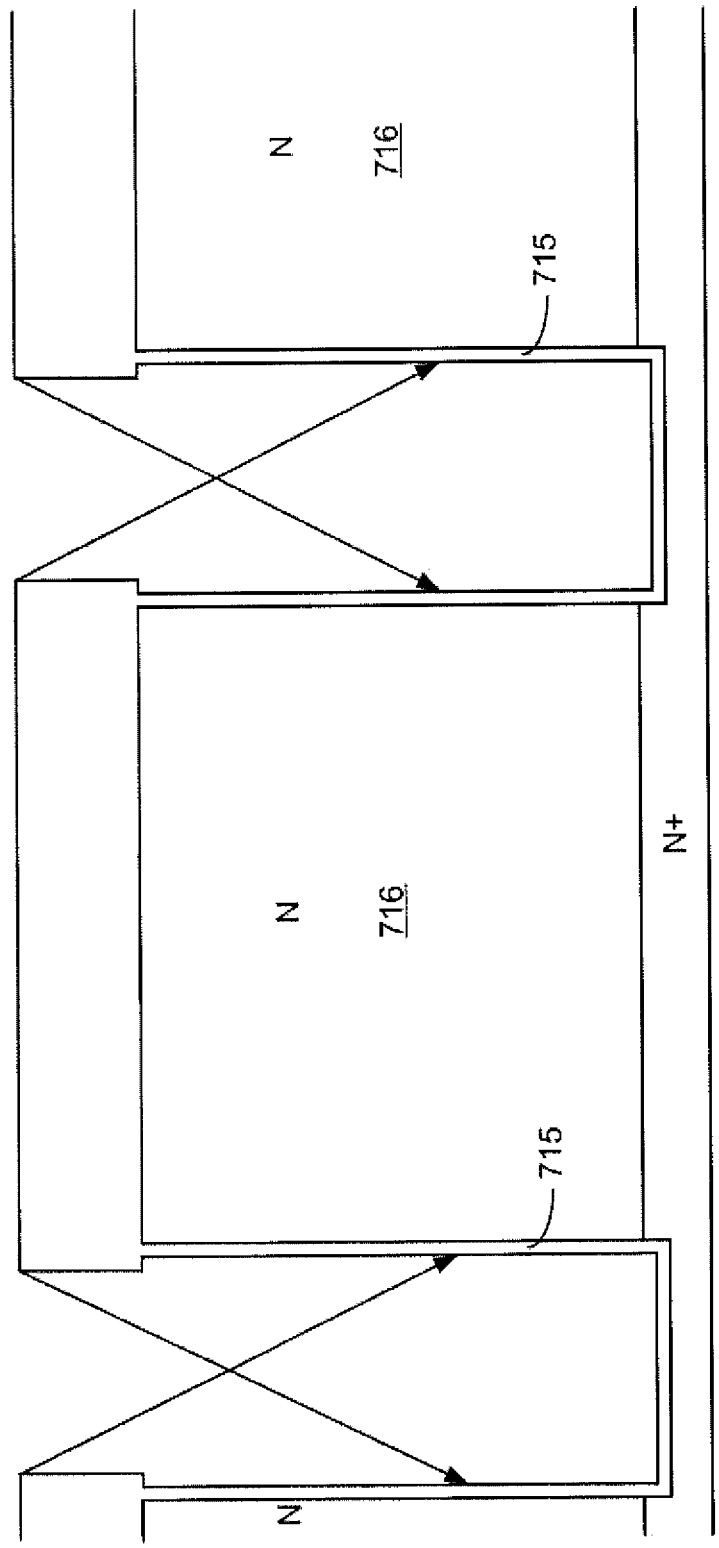

FIGS. 14A to 14I are a serial of exemplary steps that are performed to form a unit cell of the inventive super-junction trench MOSFET 700' in FIG. 12. In FIG. 14A, an N– epitaxial layer 711 is grown on an N+ substrate 712, wherein the N+ substrate 712 has a higher doping concentration than the N– epitaxial layer 711, and shares a common interface with the N– epitaxial layer 711. Next, a hard mask 714, which can be implemented by using an oxide layer, is formed covering a top surface of the N– epitaxial layer 711. Then, after a trench mask (not shown) is applied onto the hard mask 714, a pair of deep trenches 704' are etched through the hard mask 714 and into the N– epitaxial layer 711 or through the epitaxial layer 711 and into the substrate 712 by successively dry oxide etch and dry silicon etch.

In FIG. 14B, an isotropic dry silicon etch in down stream plasma is carried out to eliminate the plasma damage introduced during opening the deep trenches 704'. The hard mask 714 is still remained to block sequential angle ion implantation into the top surface of the N– epitaxial layer 711.

In FIG. 14C, a pad oxide 715 of about 100 angstroms in thickness is grown along inner surfaces of the deep trenches 704'. Then, an angle ion implantation of Phosphorus dopant followed by a Phosphorus dopant drive-in step is carried out to form an N first doped column region 716 in a mesa between sidewalls of the deep trenches 704'.

Figure 14D:
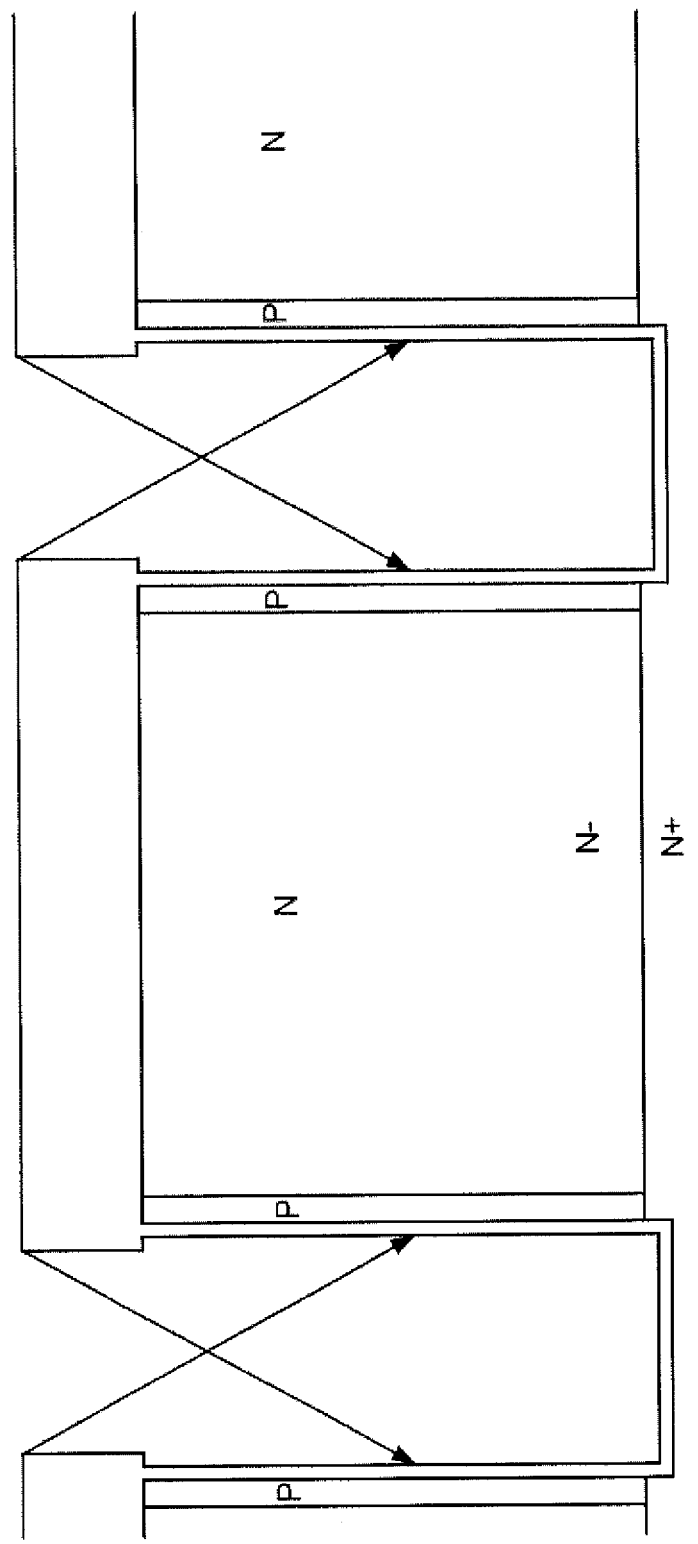
Figure 14E:
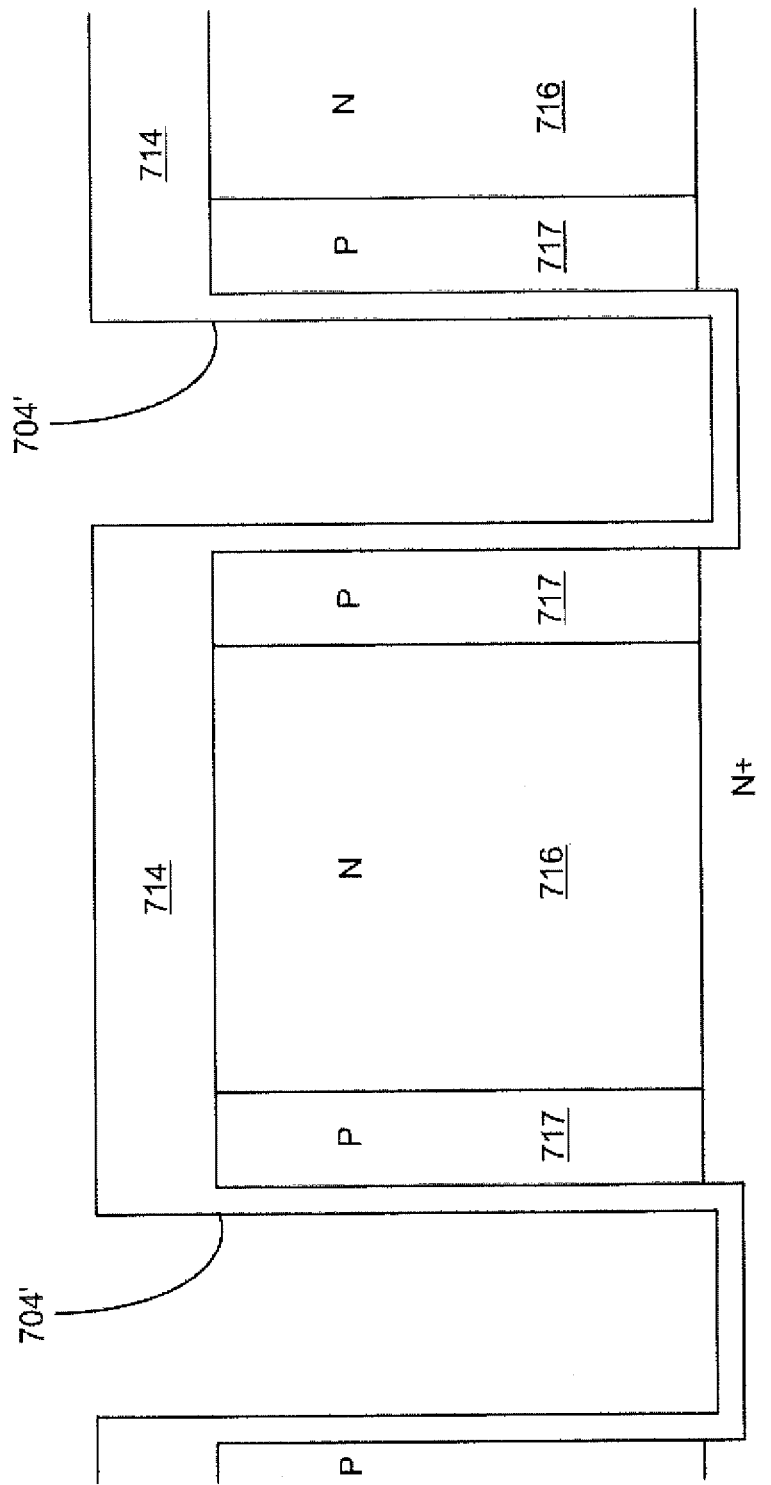

In FIG. 14D, another angle ion implantation of Boron dopant is carried out and followed by a Boron dopant diffusion step as shown in FIG. 14E to form a pair of P second doped column regions 717 with column shape adjacent to the sidewalls of the deep trenches 704', in parallel with and surrounding the N first doped column region 716.

Figure 14F:
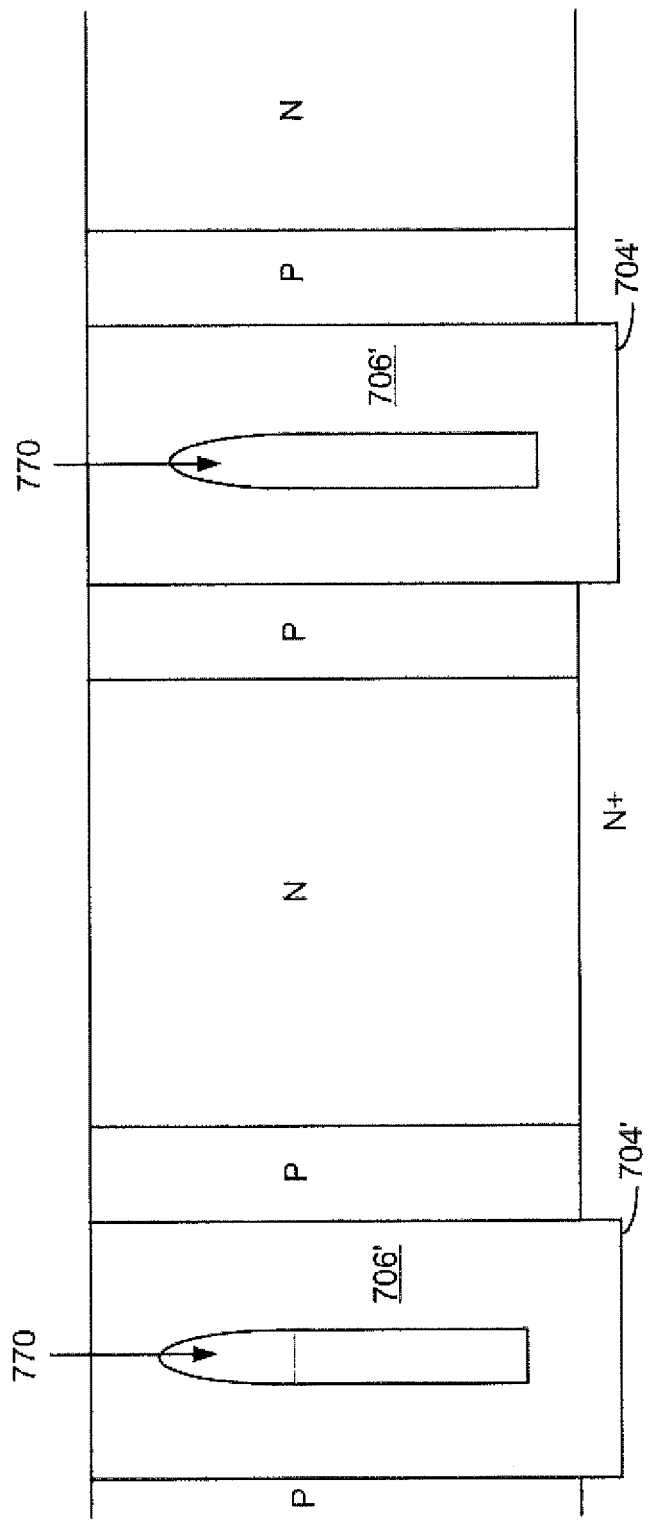

In FIG. 14F, the hark mask 714 (as shown in FIG. 14E) and the pad oxide 715 (as shown in FIG. 14C) are removed away. A dielectric material 706' is formed filling the deep trenches 704' with a buried void 770 inside the dielectric material 706' by dielectric deposition. Then, etching back or CMP the dielectric material 706' from the top surface of the N– epitaxial layer.

Figure 14G:
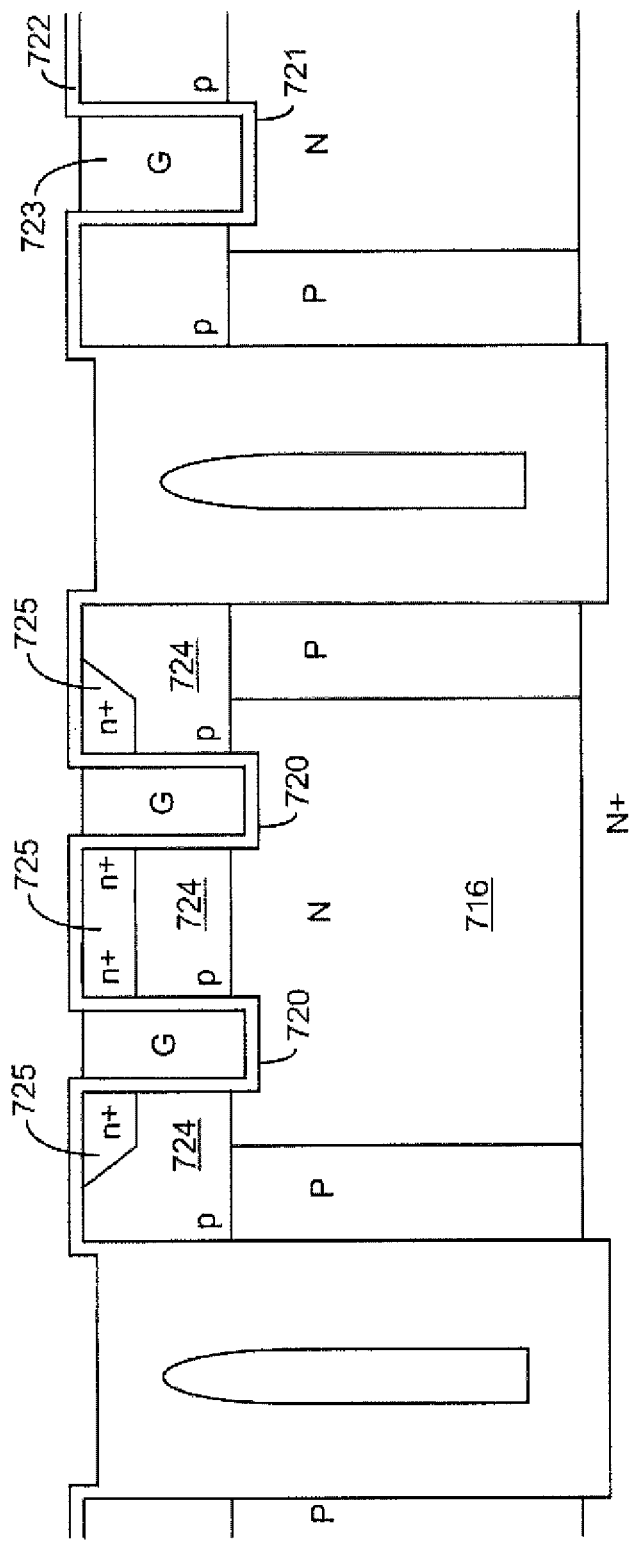

In FIG. 14G, after applying a gate trench mask (not shown), a plurality of gate trenches 720 and at least one wide gate trench 721 which has a trench width greater than the gate trenches 720 are etched into the N first doped column region 716. Afterwards, a sacrificial oxide (not shown) is grown and then removed to eliminate the plasma damage introduced during opening the gate trenches. Then, a gate oxide layer 722 is grown along inner surfaces of the gate trenches 720 and the wide gate trench 721. Then, another doped poly-silicon layer is deposited to fill the gate trenches 720 and the wide gate trench 721, and then is etched back by CMP or plasma etch to serve as gate electrodes 723. Afterwards, after applying a guard ring mask (not shown) onto the top surface of the N– epitaxial layer 711, a guard ring ion implantation is carried out and followed by a diffusion step to form multiple guard rings in a termination area (not shown). Then, after applying a body mask (not shown), an ion implantation of p type dopant is carried out and followed by diffusion to form p body regions 724. Then, after removing the body mask and applying a source mask (not shown), an ion implantation of n type dopant and a diffusion step are carried out to form n+ source regions 725 near a top surface of the p body regions 724, and the n+ source regions 725 have a higher doping concentration than the epitaxial layer 711.

Figure 14H:
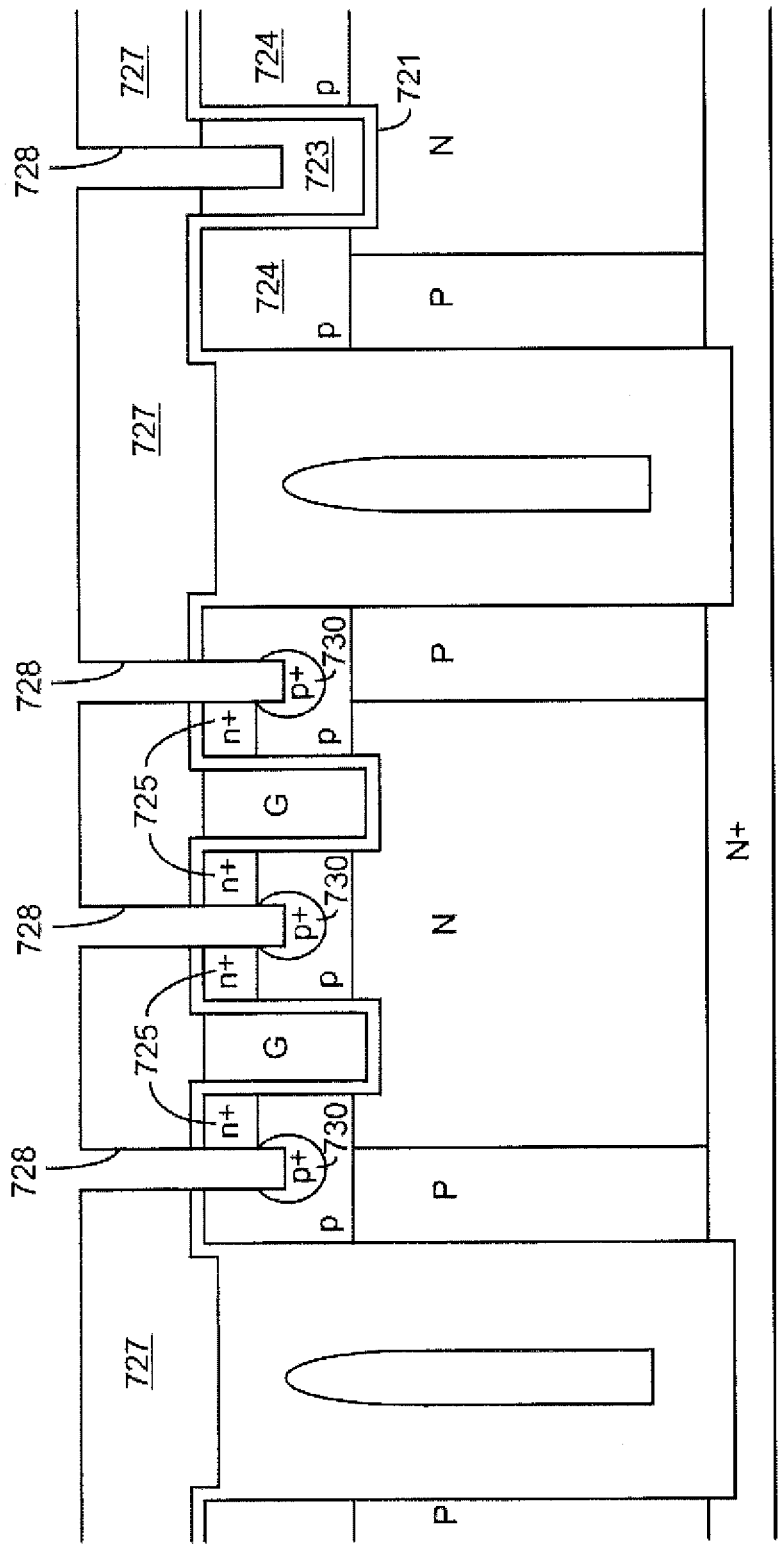

In FIG. 14H, an insulation layer is deposited onto a whole top surface of the device structure to serve as a contact interlayer 727. Then, after applying a contact mask (not shown) onto the contact interlayer 727, a plurality of contact holes are formed by successively dry oxide etch and dry silicon etch. After penetrating through the contact interlayer 727, the contact holes 728 are further penetrating through the n+ source regions 725 and extending into the p body regions 724 in the mesa, the contact holes 728' is extending into the gate electrode 723 in the wide gate trench 721. Next, a BF2 ion implantation is performed to form a plurality of p+ body contact regions 730 within the p body regions 724 and surrounding at least bottoms of the contact holes 728.

Figure 14I:
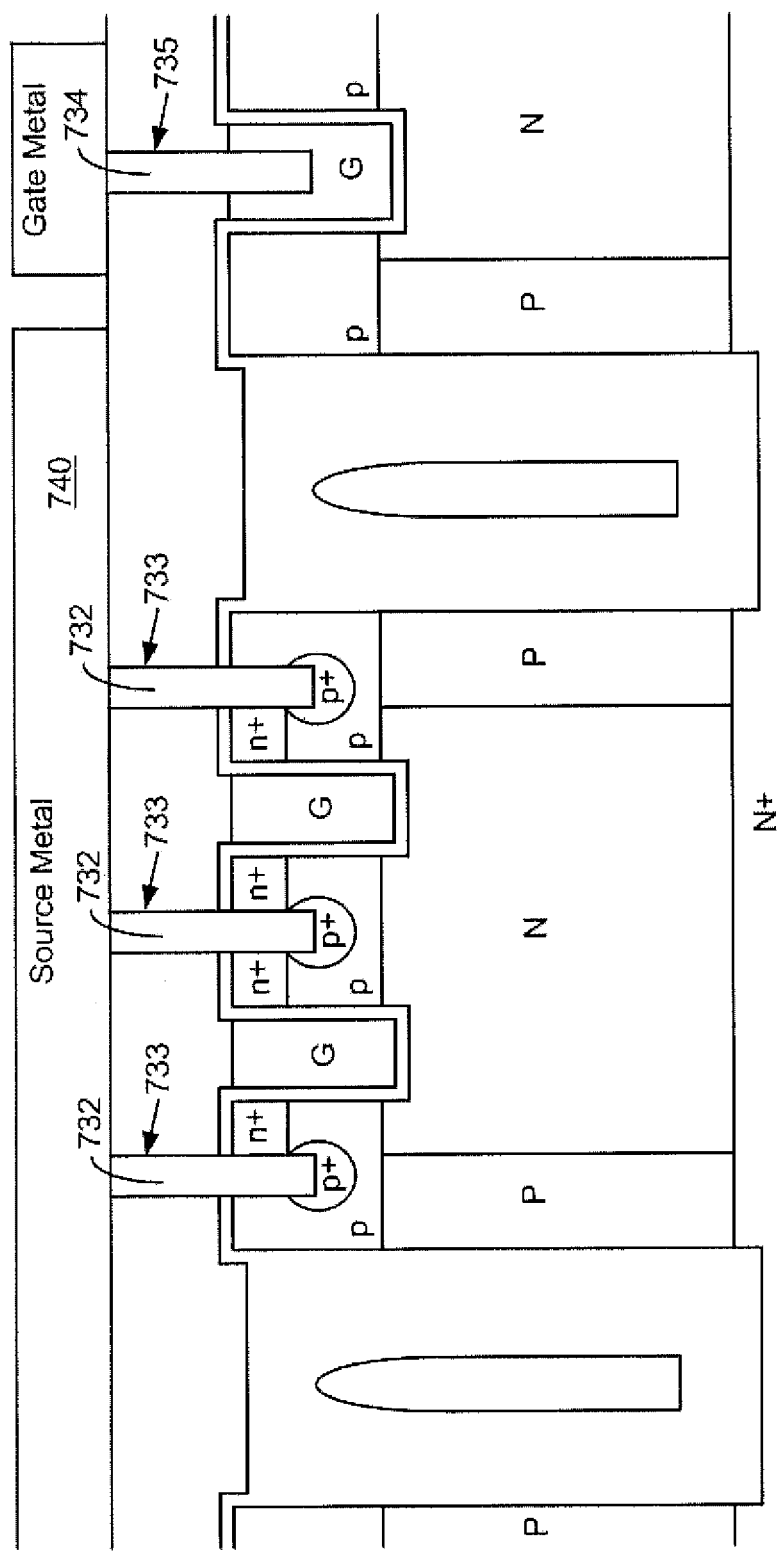

In FIG. 14I, a barrier metal layer Ti/TiN or Co/TiN or Ta/TiN is deposited on sidewalls and bottoms of all the contact holes followed by a step of RTA (Rapid Thermal Annealing) process for silicide formation. Then, a tungsten material layer is deposited onto the barrier metal layer, wherein the tungsten material layer and the barrier metal layer are then etched back to form: contact metal plugs 732 for trenched source-body contacts 733; and contact metal plug 734 for trenched gate contact 735. Then, a metal layer of Al alloys or Cu padded by a resistance-reduction layer Ti or Ti/TiN underneath is deposited onto the contact interlayer 727 and followed by a metal etching process by employing a metal mask (not shown) to form a source metal 740 and a gate metal 741.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A super junction trench MOSFET comprising a plurality of unit cells with each unit cell in an active area comprising:
    a substrate of a first conductivity type;
    an epitaxial layer of said first conductivity type grown on said substrate, said epitaxial layer having a lower doping concentration than said substrate;
    a pair of deep trenches filled with dielectric material, starting from a top surface of said epitaxial layer and down extending into said epitaxial layer, each comprising a buried void inside said dielectric material;
    a mesa between said pair of deep trenches;
    a first doped column region of said first conductivity type with column shape within each said mesa;
    a pair of second doped column regions of a second conductivity type with column shape adjacent to sidewalls of said pair of deep trenches within said mesa, in parallel with and surrounding said first doped column region;
    a body region of said second conductivity type in said mesa, covering a top surface of said first and second doped column regions, extending between said pair of deep trenches;
    at least one trenched gate filled with doped poly-silicon layer padded by a gate oxide layer, starting from the top surface of said epitaxial layer and down penetrating through said body region and extending into said first doped column in said mesa;
    multiple trenched source-body contacts with each filled with a contact metal plug extending into said body region in said mesa; and
    a source region of said first conductivity type surrounding an upper portion of each said trenched gate, extending between the upper portion of each said trenched gate and sidewalls of adjacent trenched source-body contacts.

2. The super-junction trench MOSFET of claim 1, wherein trench bottoms of said deep trenches are above said substrate.

3. The super-junction trench MOSFET of claim 1, wherein said deep trenches further extend into said substrate, and said first doped column region and said second doped column regions reach a common interface between said substrate and said epitaxial layer.

4. The super-junction trench MOSFET of claim 1 further comprising a body contact region of said second conductivity type within said body region and surrounding at least bottom of each of said multiple trenched source-body contacts, wherein said body contact region has a higher doping concentration than said body region.

5. The super-junction trench MOSFET of claim 1 further comprising a first type guard ring connected with said source region, and multiple second type guard rings having floating voltage in a termination area, wherein said first type guard ring and said multiple second type floating guard rings all have junction depths greater than said body region; and said first type guard ring is connecting with a third doped column region of said first conductivity type and a fourth doped column region of said second conductivity type through a body region wherein said third doped column region having about half column width of said first doped column region and said fourth doped column region having about same column width as said second doped column region in said unit cell.

6. The super-junction trench MOSFET of claim 1, wherein said contact metal plug is a tungsten plug padded by a barrier metal layer of Ti/TiN or Co/TiN or Ta/TiN.

7. The super-junction trench MOSFET of claim 1 further comprising at least one trenched gate for gate connection which is connected to a gate metal via a trenched gate contact filled with said contact metal plug.

8. The super-junction trench MOSFET of claim 1 wherein said gate oxide layer has oxide thickness on trenched gate bottom equal to or thinner than trenched gate sidewall.

9. The super-junction trench MOSFET of claim 1 wherein said gate oxide layer has oxide thickness on trenched gate bottom thicker than trenched gate sidewall.

10. A method for manufacturing a unit cell of a super-junction trench MOSFET comprising the steps of:
    forming a pair of deep trenches inside an epitaxial layer of a first conductivity type onto a substrate of said first conductivity type;
    carrying out angle ion implantation of said first conductivity type dopant and diffusion to form a first doped column region with column shape within a mesa area between every two adjacent of said deep trenches;
    carrying out angle ion implantation of a second conductivity type dopant and diffusion to form second doped column regions with column shape adjacent to sidewalls of said deep trenches, in parallel with and surrounding said first doped column region;
    depositing a dielectric material with buried voids in said deep trenches;
    applying a gate trench mask to form at least one gate trench in said mesa by etching into said first doped column region;
    forming a least one trenched gates extending into said first doped column region between said pair of deep trenches; and
    forming body regions of said second conductivity type and source regions of said first conductivity type.

11. The method of claim 10 further comprising forming a plurality of trenched source-body contacts penetrating through a contact interlayer and extending into body regions between said pair of deep trenches.

* * * * *